(12) United States Patent
LaChapelle et al.

(10) Patent No.: US 10,267,918 B2
(45) Date of Patent: Apr. 23, 2019

(54) LIDAR DETECTOR HAVING A PLURALITY OF TIME TO DIGITAL CONVERTERS INTEGRATED ONTO A DETECTOR CHIP

(71) Applicant: LUMINAR TECHNOLOGIES, INC., Orlando, FL (US)

(72) Inventors: Joseph G. LaChapelle, Philomath, OR (US); Jason M. Eichenholz, Orlando, FL (US); Stephen D. Gaalema, Colorado Springs, CO (US); Austin K. Russell, Orlando, FL (US)

(73) Assignee: Luminar Technologies, Inc., Orlando, FL (US)

( * ) Notice: Subject to any disclaimer, the term of this patent is extended or adjusted under 35 U.S.C. 154(b) by 0 days.

(21) Appl. No.: 16/017,650

(22) Filed: Jun. 25, 2018

(65) Prior Publication Data

US 2018/0306926 A1 Oct. 25, 2018

Related U.S. Application Data

(63) Continuation of application No. 15/727,073, filed on Oct. 6, 2017, now Pat. No. 10,007,001.

(Continued)

(51) Int. Cl.
*G01S 17/89* (2006.01)
*G01S 7/48* (2006.01)
(Continued)

(52) U.S. Cl.
CPC ............. *G01S 17/89* (2013.01); *G01J 1/44* (2013.01); *G01S 7/003* (2013.01); *G01S 7/4802* (2013.01); *G01S 7/484* (2013.01);
*G01S 7/487* (2013.01); *G01S 7/4817* (2013.01); *G01S 7/4818* (2013.01); *G01S 7/4865* (2013.01);
(Continued)

(58) Field of Classification Search
CPC ... G01J 1/44; G01J 2001/4466; G01S 7/4817; G01S 7/484; G01S 7/4865; G01S 7/497; G01S 17/10; G01S 17/89; G01S 17/936
See application file for complete search history.

(56) References Cited

U.S. PATENT DOCUMENTS 4,856,893 A 8/1989 Breen
5,696,778 A 12/1997 MacPherson
(Continued)

OTHER PUBLICATIONS

International Search Report and Written Opinion for Application No. PCT/US2018/024906, dated Jul. 20, 2018.
(Continued)

*Primary Examiner* — Mark R Gaworecki

(57) ABSTRACT

A scanning system includes a light source configured to emit light as a series of one or more light pulses, a scanner configured to direct the one or more light pulses towards a remote target, and a receiver configured to detect light scattered by the remote target. The receiver includes a light detector element disposed on an ASIC that includes multiple comparators disposed in parallel with one another, and corresponding time-to-digital converters (TDCs) coupled to the comparator. Each of the comparators processes a received electrical signal from the light detector element to produce a digital edge signal when the amplitude of the received electrical signal reaches a particular threshold. A corresponding TDC outputs a time delay value associated with a time at which the received electrical signal reaches the particular threshold.

20 Claims, 15 Drawing Sheets

Related U.S. Application Data

(60) Provisional application No. 62/477,944, filed on Mar. 28, 2017.

(51) Int. Cl.

| | | |
|---|---|---|
| *G01J 1/44* | (2006.01) | |
| *G01S 17/93* | (2006.01) | |
| *G01S 7/481* | (2006.01) | |
| *G01S 7/497* | (2006.01) | |
| *G01S 17/10* | (2006.01) | |
| *G01S 7/486* | (2006.01) | |
| *G01S 7/484* | (2006.01) | |
| *G01S 17/42* | (2006.01) | |
| *G01S 17/87* | (2006.01) | |
| *G01S 7/00* | (2006.01) | |
| *G01S 7/487* | (2006.01) | |
| *H01L 31/09* | (2006.01) | |

(52) U.S. Cl.
CPC .............. *G01S 7/497* (2013.01); *G01S 17/10* (2013.01); *G01S 17/42* (2013.01); *G01S 17/87* (2013.01); *G01S 17/936* (2013.01); *G01J 2001/4466* (2013.01); *H01L 31/09* (2013.01)

(56) References Cited

U.S. PATENT DOCUMENTS

| | | |
|---|---|---|
| 5,867,305 A | 2/1999 | Waarts et al. |
| 5,872,621 A | 2/1999 | Wilkerson et al. |
| 5,892,575 A | 4/1999 | Marino |
| 5,978,736 A | 11/1999 | Greendale |
| 6,449,384 B2 | 9/2002 | Laumeyer et al. |
| 6,493,653 B1 | 12/2002 | Drinkard et al. |
| 6,512,993 B2 | 1/2003 | Kacyra et al. |
| 6,710,324 B2 | 3/2004 | Hipp |
| 6,723,975 B2 | 4/2004 | Saccomanno |
| 6,747,747 B2 | 6/2004 | Hipp |
| 6,759,649 B2 | 7/2004 | Hipp |
| 7,012,248 B2 | 3/2006 | Paschalidis |
| 7,092,548 B2 | 8/2006 | Laumeyer et al. |
| 7,180,579 B1 | 2/2007 | Ludwig et al. |
| 7,209,221 B2 | 4/2007 | Breed et al. |
| 7,345,271 B2 | 3/2008 | Boehlau et al. |
| 7,443,903 B2 | 10/2008 | Leonardo et al. |
| 7,532,311 B2 | 5/2009 | Henderson et al. |
| 7,570,793 B2 | 8/2009 | Lages et al. |
| 7,583,364 B1 | 9/2009 | Mayor et al. |
| 7,649,920 B2 | 1/2010 | Welford |
| 7,652,752 B2 | 1/2010 | Fetzer et al. |
| 7,872,794 B1 | 1/2011 | Minelly et al. |
| 7,902,570 B2 | 3/2011 | Itzler et al. |
| 7,945,408 B2 | 5/2011 | Dimsdale et al. |
| 7,969,558 B2 | 6/2011 | Hall |
| 7,995,796 B2 | 8/2011 | Retterath et al. |
| 8,059,263 B2 | 11/2011 | Haberer et al. |
| 8,072,663 B2 | 12/2011 | O'Neill et al. |
| 8,081,301 B2 | 12/2011 | Stann et al. |
| 8,138,849 B2 | 3/2012 | West et al. |
| 8,279,420 B2 | 10/2012 | Ludwig et al. |
| 8,280,623 B2 | 10/2012 | Trepagnier et al. |
| 8,346,480 B2 | 1/2013 | Trepagnier et al. |
| 8,364,334 B2 | 1/2013 | Au et al. |
| 8,452,561 B2 | 5/2013 | Dimsdale et al. |
| 8,541,744 B1 | 9/2013 | Liu |
| 8,548,014 B2 | 10/2013 | Fermann et al. |
| 8,625,080 B2 | 1/2014 | Heizmann et al. |
| 8,625,081 B2 | 1/2014 | Kostamovaara |
| 8,675,181 B2 | 3/2014 | Hall |
| 8,723,955 B2 | 5/2014 | Kiehn et al. |
| 8,766,682 B2 | 7/2014 | Williams |
| 8,767,190 B2 | 7/2014 | Hall |
| 8,796,605 B2 | 8/2014 | Mordarski et al. |
| 8,804,787 B1 | 8/2014 | Coleman et al. |
| 8,836,922 B1 | 9/2014 | Pennecot et al. |
| 8,866,654 B2 | 10/2014 | Mann et al. |
| 8,880,296 B2 | 11/2014 | Breed |
| 8,896,818 B2 | 11/2014 | Walsh et al. |
| 8,934,509 B2 | 1/2015 | Savage-Leuchs et al. |
| 9,000,347 B2 | 4/2015 | Woodward et al. |
| 9,041,136 B2 | 5/2015 | Chia |
| 9,048,370 B1 | 6/2015 | Urmson et al. |
| 9,063,549 B1 | 6/2015 | Pennecot et al. |
| 9,069,060 B1 | 6/2015 | Zbrozek et al. |
| 9,074,878 B2 | 7/2015 | Steffey et al. |
| 9,086,273 B1 | 7/2015 | Gruver et al. |
| 9,086,481 B1 | 7/2015 | Dowdall et al. |
| 9,091,754 B2 | 7/2015 | d'Aligny |
| 9,103,669 B2 | 8/2015 | Giacotto et al. |
| 9,121,703 B1 | 9/2015 | Droz et al. |
| 9,160,140 B2 | 10/2015 | Gusev et al. |
| 9,170,333 B2 | 10/2015 | Mheen et al. |
| 9,199,641 B2 | 12/2015 | Ferguson et al. |
| 9,213,085 B2 | 12/2015 | Kanter |
| 9,239,260 B2 | 1/2016 | Bayha et al. |
| 9,246,041 B1 | 1/2016 | Clausen et al. |
| 9,285,464 B2 | 3/2016 | Pennecot et al. |
| 9,285,477 B1 | 3/2016 | Smith et al. |
| 9,297,901 B2 | 3/2016 | Bayha et al. |
| 9,299,731 B1 | 3/2016 | Lenius et al. |
| 9,304,154 B1 | 4/2016 | Droz et al. |
| 9,304,203 B1 | 4/2016 | Droz et al. |
| 9,304,316 B2 | 4/2016 | Weiss et al. |
| 9,310,471 B2 | 4/2016 | Sayyah et al. |
| 9,335,255 B2 | 5/2016 | Retterath et al. |
| 9,360,554 B2 | 6/2016 | Retterath et al. |
| 9,368,933 B1 | 6/2016 | Nijjar et al. |
| 9,378,843 B1 | 6/2016 | Hossain et al. |
| 9,383,201 B2 | 7/2016 | Jachman et al. |
| 9,383,445 B2 | 7/2016 | Lu et al. |
| 9,823,353 B2 | 3/2017 | Eichenholz et al. |
| 2002/0041435 A1 | 4/2002 | Krummrich |
| 2002/0060784 A1 | 5/2002 | Pack et al. |
| 2003/0043058 A1 | 3/2003 | Jamieson et al. |
| 2005/0214690 A1 | 9/2005 | Verheijden et al. |
| 2006/0231771 A1 | 10/2006 | Lee et al. |
| 2006/0290920 A1 | 12/2006 | Kampchen et al. |
| 2007/0040121 A1 | 2/2007 | Kalayeh |
| 2007/0052947 A1 | 3/2007 | Ludwig et al. |
| 2007/0182949 A1 | 8/2007 | Niclass |
| 2008/0027591 A1 | 1/2008 | Lenser et al. |
| 2008/0074640 A1 | 3/2008 | Walsh et al. |
| 2008/0181266 A1 | 7/2008 | Deladurantaye et al. |
| 2008/0309913 A1 | 12/2008 | Fallon |
| 2009/0122295 A1 | 5/2009 | Eaton |
| 2009/0185159 A1 | 7/2009 | Rohner et al. |
| 2009/0262760 A1 | 10/2009 | Krupkin et al. |
| 2009/0273770 A1 | 11/2009 | Bauhahn et al. |
| 2010/0034221 A1 | 2/2010 | Dragic |
| 2010/0091263 A1 | 4/2010 | Kumagai et al. |
| 2010/0128744 A1 | 5/2010 | Deladurantaye et al. |
| 2010/0165323 A1 | 7/2010 | Fiess et al. |
| 2010/0231774 A1 | 9/2010 | Tashiro |
| 2011/0085149 A1 | 4/2011 | Nathan |
| 2012/0168605 A1 | 7/2012 | Milanovic |
| 2012/0206712 A1 | 8/2012 | Chang et al. |
| 2012/0227263 A1 | 9/2012 | Leclair et al. |
| 2012/0268105 A1 | 10/2012 | Mann et al. |
| 2013/0010820 A1 | 1/2013 | Curtis |
| 2013/0033742 A1 | 2/2013 | Rogers et al. |
| 2013/0175435 A1 | 7/2013 | Drader |
| 2013/0182239 A1 | 7/2013 | Kaiser |
| 2013/0282208 A1 | 10/2013 | Mendez-Rodriguez et al. |
| 2014/0111805 A1 | 4/2014 | Albert et al. |
| 2014/0168631 A1 | 6/2014 | Haslim et al. |
| 2014/0176933 A1 | 6/2014 | Haslim et al. |
| 2014/0211194 A1 | 7/2014 | Pacala et al. |
| 2014/0268098 A1 | 9/2014 | Schwarz et al. |
| 2014/0268311 A1 | 9/2014 | Zhu |
| 2014/0293263 A1 | 10/2014 | Justice et al. |
| 2014/0293266 A1 | 10/2014 | Hsu et al. |
| 2014/0330479 A1 | 11/2014 | Dolgov |
| 2014/0376001 A1 | 12/2014 | Swanson |
| 2015/0109605 A1 | 4/2015 | Major, Jr. et al. |

(56) References Cited

U.S. PATENT DOCUMENTS

| | | |
|---|---|---|
| 2015/0131080 A1 | 5/2015 | Retterath et al. |
| 2015/0177368 A1 | 6/2015 | Bayha et al. |
| 2015/0185244 A1 | 7/2015 | Inoue et al. |
| 2015/0185313 A1 | 7/2015 | Zhu |
| 2015/0192676 A1 | 7/2015 | Kotelnikov et al. |
| 2015/0192677 A1 | 7/2015 | Yu et al. |
| 2015/0204978 A1 | 7/2015 | Hammes et al. |
| 2015/0214690 A1 | 7/2015 | Savage-Leuchs et al. |
| 2015/0219765 A1 | 8/2015 | Mead et al. |
| 2015/0301182 A1 | 10/2015 | Geiger et al. |
| 2015/0323654 A1 | 11/2015 | Jachmann et al. |
| 2015/0378023 A1 | 12/2015 | Royo Royo et al. |
| 2015/0378241 A1 | 12/2015 | Eldada |
| 2016/0025842 A1 | 1/2016 | Anderson et al. |
| 2016/0047901 A1 | 2/2016 | Pacala et al. |
| 2016/0049765 A1 | 2/2016 | Eldada |
| 2016/0146926 A1 | 5/2016 | Jungwirth |
| 2016/0146939 A1 | 5/2016 | Shpunt et al. |
| 2016/0146940 A1 | 5/2016 | Koehler |
| 2016/0161600 A1 | 6/2016 | Eldada et al. |
| 2016/0209449 A1 | 7/2016 | Palka et al. |
| 2016/0245919 A1 | 8/2016 | Kalscheur et al. |
| 2016/0274025 A1 | 9/2016 | Skibo et al. |

OTHER PUBLICATIONS

Ailisto et al., "Scannerless imaging pulsed-laser range finding," Journal of Optics A: Pure and Applied Optics, 4(6):S337-S346 (2002).
Georgakopoulou et al., "A 100-ps Multi-Time over Threshold Data Acquisition System for Cosmic Ray Detection," Journal of Nuclear Instruments and Methods in Physics Research (2018).
Johnson et al., "Adaptive LADAR Receiver for Multispectral Imaging," Proceedings of SPIE—The International Society for Optical Engineering (2001).
Kim et al., "A Multi-Threshold Sampling Method for (TOF) PET Signal Processing," Nucl Instrum Phys Res A, 602(2):618-621 (2009).
Kostamovaara et al., "TDC chip set for accurate pulsed time-of-flight laser ranging," EMEA (2012).
Kurtti et al., "A Wide Dynamic Range CMOS Laser Radar Receiver With a Time-Domain Walk Error Compensation Scheme," IEEE Transactions on Circuits and Systems I: Regular Papers, 64(3):550-561 (2017).
Kurtti et al., "An integrated receiver channel for a laser scanner," Conference Record—IEEE Instrumentation and Measurement Technology Conference (2012).
Kurtti et al., "CMOS receiver for a pulsed TOF laser rangefinder utilizing the time domain walk compensation scheme," Conference: 20th IMEKO TC-4 Symposium Measurement of Electrical Quantities, At Benevento Italy, pp. 111-115 (2014).
Monzo et al., "Evaluation of a timing integrated circuit architecture for continuous crystal and SiPM based PET systems," 14th International Workshop on Radiation Imaging Detectors (2012).
Paschalidis et al., "Science Enabling ASICs and FEEs for the JUICE and JEO Missions," NASA (2011).
Quilligan et al., "Lidar Luminance Quantizer," NASA (2011).
Cao et al., "Design and Assessment of a 6 ps-Resolution Time-to-Digital Converter," 2nd International Conference on Advancements in Nuclear Instrumentation, Measurement Methods and their Applications (2011).
Frolov et al., "Double Threshold Discriminator for Timing Measurements," Nuclear Instruments and Methods in Physics Research Section A: Accelerators, Spectrometers, Detectors and Associated Equipment, 356(2-3):447-451 (1995). Abstract Only.
Jansson et al., "A Multi-Channel High Precision CMOS Time-to-Digital Converter for Laserscanner Based Perception Systems," IEEE Transactions on Instrumentation and Measurement, 61(9): 2581-2590 (2012).
Jansson et al., "Multi-Channel Wide Range Time-to-Digital Converter with Better than 9ps RMS Precision for Pulsed Time-of-flight Laser Rangefinding," Proceedings of the ESSCIRC (ESSCIRC) (2012).
Kostamovaara et al., "On the minimization of timing walk in industrial pulsed time-of-flight laser radars," Proceedings of SPIE—The International Society for Optical Engineering (2009).
Kurtti et al., "A Laser Scanner Chip Set for Accurate Perception Systems," Advanced Microsystems for Automotive Applications, pp. 313-322 (2012).
Redant et al., "A Low Power Time-of-Arrival Ranging Front End Based on a 8-Channel 2.2mW, 53ps Single-Shot-Precision Time-to-Digial Converter," Solid State Circuits Conference (2011). Abstract Only.
Redant et al., "Joint Estimation of Propagation Delay Dispersion and Time of Arrival," IEEE Transactions on Circuits and Systems II: Express Briefs, 60(2):76-80 (2013).
Redant et al., "Multiple Event Time-to-Digital Conversion-Based Pulse Digitization for a 250 MHz Pulse Radio Ranging Application," IEEE Transactions on Circuits and Systems , 58(11:2614-2622 (2011).
Scarpaci et al., "Time to Digital converter implementation on a configurable digital processor for BaF2 scintillation detector events," IEEE Nuclear Science Symposium Conference Record (2008).
Office Action dated Aug. 14, 2017 in U.S. Appl. No. 15/470,708, 15 pgs.
Office Action dated Jul. 13, 2017 in U.S. Appl. No. 15/470,718, 17 pgs.
Search Report and Written Opinion in corresponding PCT Application No. PCT/US2016/064020 dated Apr. 4, 2017, 37 pgs.
U.S. Appl. No. 15/180,580, filed Jun. 13, 2016, Hall.

LIDAR DETECTOR HAVING A PLURALITY OF TIME TO DIGITAL CONVERTERS INTEGRATED ONTO A DETECTOR CHIP

RELATED APPLICATIONS

This application is a continuation of U.S. patent application Ser. No. 15/727,073, filed Oct. 6, 2017; which claims priority to U.S. Provisional Patent Application No. 62/477,944, filed Mar. 28, 2017; the entire disclosures of which are hereby expressly incorporated by reference herein.

FIELD OF TECHNOLOGY

This disclosure generally relates to lidar systems and, more particularly, to a lidar system that operates as an active short-wave infrared four-dimensional camera.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Light detection and ranging (lidar) is a technology that can be used to measure distances to remote targets. Typically, a lidar system includes a light source and an optical receiver. The light source can be, for example, a laser which emits light having a particular operating wavelength. The operating wavelength of a lidar system may lie, for example, in the infrared, visible, or ultraviolet portions of the electromagnetic spectrum. The light source emits light toward a target which then scatters the light. Some of the scattered light is received back at the receiver. The system determines the distance to the target based on one or more characteristics associated with the returned light. For example, the system may determine the distance to the target based on the time of flight of a returned light pulse.

SUMMARY

A lidar system operates as an active short-wave infrared (SWIR) camera system to determine a four-dimensional image at each point in a two-dimensional field of regard. The camera system includes a scanner that transmits a pulse of light, preferably at the short-wave infrared spectrum, at a particular position or coordinate in a two-dimensional field of regard and a receiver that detects return pulses scattered from a target in the field of regard coincident with the particular position. The camera system receiver has a detector that detects the returned pulse, a range determination unit that determines, based on the timing of the returned pulse, a distance to the target at the particular position, and an intensity measurement unit that determines the magnitude, amplitude, or intensity of the returned pulse, which information provides an indication of the relative, or in some cases, absolute reflectivity of the target at the particular point in the field of regard. As a result, the camera system detects four components of each pixel in a two-dimensional field of regard, including the x and y positions in the two-dimensional imaging plane, a z position indicating a range or distance to the target at the x and y position, and an intensity or reflectivity of the target at the x, y, and z, position.

In one example, the range determination and the intensity measurement units may use a plurality of time to digital converters (TDCs) to determine the amplitude envelope of the returned pulse which, in turn, can be processed to determine a highly accurate range to the target as well as an intensity profile of the returned pulse, wherein the intensity profile of the returned pulse can be used to characterize the pulse and to determine an absolute or relative reflectivity of the target. In one case, the system may include and use a look-up table that stores, for a number of targets with various different target reflectivities disposed at different ranges, a determined target reflectivity of the target at a particular range and its associated intensity profile.

In another embodiment, an active camera system comprises a light source configured to emit light as a series one or more light pulses, which may be coherent light pulses, a scanner configured to direct the one or more light pulses towards a remote target at a particular position in a two-dimensional field of regard, and a receiver configured to detect one or more light pulses scattered by the remote target. The receiver may include a detector element that detects a scattered light pulse at a particular position in the two-dimensional field of regard, a range determination unit that determines, based on the timing of the receipt of the scattered light pulse, a distance to the target at the particular position in the field of regard, and an intensity measurement unit that determines an intensity profile of the scattered light pulse. The intensity measurement unit may also determine, from the intensity profile, an indication of the reflectivity of the target at the particular position in the field of regard.

In another embodiment, an active camera system includes a light source configured to emit light as a series one or more light pulses, a scanner configured to direct the one or more light pulses towards a remote target at a particular position in a two-dimensional field of regard, and a receiver configured to detect one or more light pulses scattered by the remote target. The receiver may include a detector element that detects a scattered light pulse at the particular position in the two-dimensional field of regard, a range determination unit that determines, based on the timing of the receipt of the scattered light pulse, a distance to the target at the particular position in the field of regard, an intensity measurement unit that determines an intensity profile of the scattered light pulse and determines from the intensity profile an indication of the reflectivity of the target at the particular position in the field of regard.

The light source may be a laser, and the detector element may include an avalanche photodiode, such as a linear-mode avalanche photodiode. Moreover, the detector element may be or include an indium-gallium-arsenide (InGaAs) semiconductor material.

If desired, the receiver may further include a plurality of amplitude detectors coupled to the detector element, wherein each of the plurality of amplitude detectors includes a comparator and a time-to-digital converter coupled to the comparator to produce a representation of a time delay between when one of the light pulses was emitted and a scattered light pulse was received. A first one of the plurality of amplitude detectors may detect a rising edge of the scattered light pulse from the remote target and a second one of the plurality of amplitude detectors may detect a falling edge of the scattered light pulse from the remote target. The receiver may also include an envelope detector coupled to the plurality of amplitude detectors that determines an amplitude envelope (which may be referred to as a magnitude envelope) of a scattered light pulse based on the time delays determined by the plurality of amplitude detectors. The intensity measurement unit may determine an intensity of the scattered light pulse based on the time delays determined by three or more of the plurality of amplitude detectors. Likewise, a comparator of a first one of the plurality of amplitude detectors may compare an indication of a detected scattered light pulse to a first threshold and a comparator of a second one of the plurality of amplitude detectors may compare an indication of the detected scattered light pulse to a second threshold different than the first threshold. Additionally, or in other cases, the one or more of the comparators may be rising-edge comparators and one or more other ones of the comparators may be falling-edge comparators. Likewise, the plurality of amplitude detectors may be electrically connected in parallel to each other.

In still a further case, the intensity measurement unit may determine a maximum intensity of the scattered light pulse at a detected distance to the target, such as a theoretical maximum intensity if the target were 100 percent reflective, and may determine the reflectivity of the target by comparing the maximum intensity of the scattered light pulse to the intensity profile of the scattered light pulse. The intensity measurement may, for example, determine the reflectivity of the remote target as a ratio of an intensity based on the intensity profile of the scattered light pulse to the maximum intensity of the scattered light pulse. In other cases, the intensity measurement unit may include a look-up table and determine a reflectivity of the remote target from the look-up table based on an intensity value of the intensity profile of the scattered light pulse and the detected distance to the target.

If desired, the range determination unit may determine a distance to the target at the particular position in the field of regard based on a detected center of the detected scattered light pulse to thereby correct for the phenomenon known as range walk.

In another embodiment, a method of imaging a remote target includes generating a light pulse for a position in a two-dimensional scanning field of regard, emitting the generated light pulse towards a remote target in the position of the two-dimensional field of regard, and receiving a scattered light pulse scattered from the remote target. The method may then detect a receive time associated with the received scattered light pulse, determine a range to the target based on the receive time of the received scattered light pulse, detect an intensity of the received scattered light pulse, and determine a reflectivity of the remote target from the determined range to the remote target and the detected intensity of the received scattered light pulse.

Detecting a receive time associated with the received scattered light pulse may include detecting an amplitude of the received scattered light pulse at a plurality of temporal positions along the received scattered light pulse, including, at each of the plurality of temporal positions along the received scattered light pulse, comparing the amplitude of the received scattered light pulse at the temporal position along the received scattered light pulse to a plurality of thresholds and time-to-digital converting the received scattered light pulse when the amplitude of the received scattered light pulse at the temporal position matches one of the plurality of thresholds to produce a time delay signal representing a time delay between when the generated light pulse was emitted and when the temporal position along the received scattered light pulse was received.

The method may include determining a time delay associated with a center of received scattered light pulse based on one or more of the time delay signals and determining the range to the target based on a time delay associated with the center of the received scattered light pulse. Moreover, detecting an intensity of the received scattered light pulse may include determining an amplitude envelope of the received scattered light pulse and determining an intensity of the received scattered light pulse from the amplitude envelope of the received scattered light pulse. Likewise, determining an intensity of the received scattered light pulse from the amplitude envelope of the received scattered light pulse may include determining a width of the received scattered light pulse and determining the intensity of the received scattered light pulse from the width of the received scattered light pulse, and/or may include determining a maximum amplitude of the received scattered light pulse and determining the intensity of the received scattered light pulse from the maximum amplitude of the received scattered light pulse.

In some cases, determining an amplitude envelope of the received scattered light pulse may include comparing a detected amplitude of the received scattered light pulse at each of a plurality of temporal positions along the received scattered light pulse to each of a plurality of amplitude thresholds and producing a representation of a time delay between when a light pulse was emitted and when the temporal position of the received scattered light pulse was received based on the comparisons Likewise, comparing a detected amplitude of the received scattered light pulse may include detecting when a rising edge of the received scattered light pulse meets a particular threshold and detecting when a falling edge of the received scattered light pulse meets the particular threshold.

Still further, determining a reflectivity of the remote target may include determining a maximum intensity (e.g., a theoretical maximum possible intensity) of a scattered light pulse at the detected range to the remote target and determining the reflectivity of the remote target by comparing the maximum intensity of a scattered light pulse at the detected range to the remote target to the detected intensity of the received scattered light pulse. For example, determining the reflectivity of the remote target may include determining a ratio of the detected intensity of the received scattered light pulse to the maximum possible intensity of a scattered light pulse at the detected range to the remote target. Determining a reflectivity of the remote target may also or instead include determining a reflectivity of the remote target from a look-up table based on the determined intensity of the received scattered light pulse and the detected range to the target.

In another embodiment, an imaging system includes a laser light source that emits light as a series one or more light pulses, a controller that controls the laser light source to emit one or more light pulses towards a remote target, a light detector configured to detect a light pulse scattered by the remote target to produce electronic signals indicative of the scattered light pulse, and a pulse detector that detects an envelope of the scattered light pulse from the electronic signals. Still further, the imaging system includes a range processor that determines, based on a timing of the receipt of the scattered light pulse, a range to the target, an intensity measurement unit that determines an intensity indication of the scattered light pulse from the envelope of the scattered light pulse and determines the reflectivity of the target from the intensity indication and the determined range to the target.

DETAILED DESCRIPTION

Figure 3:
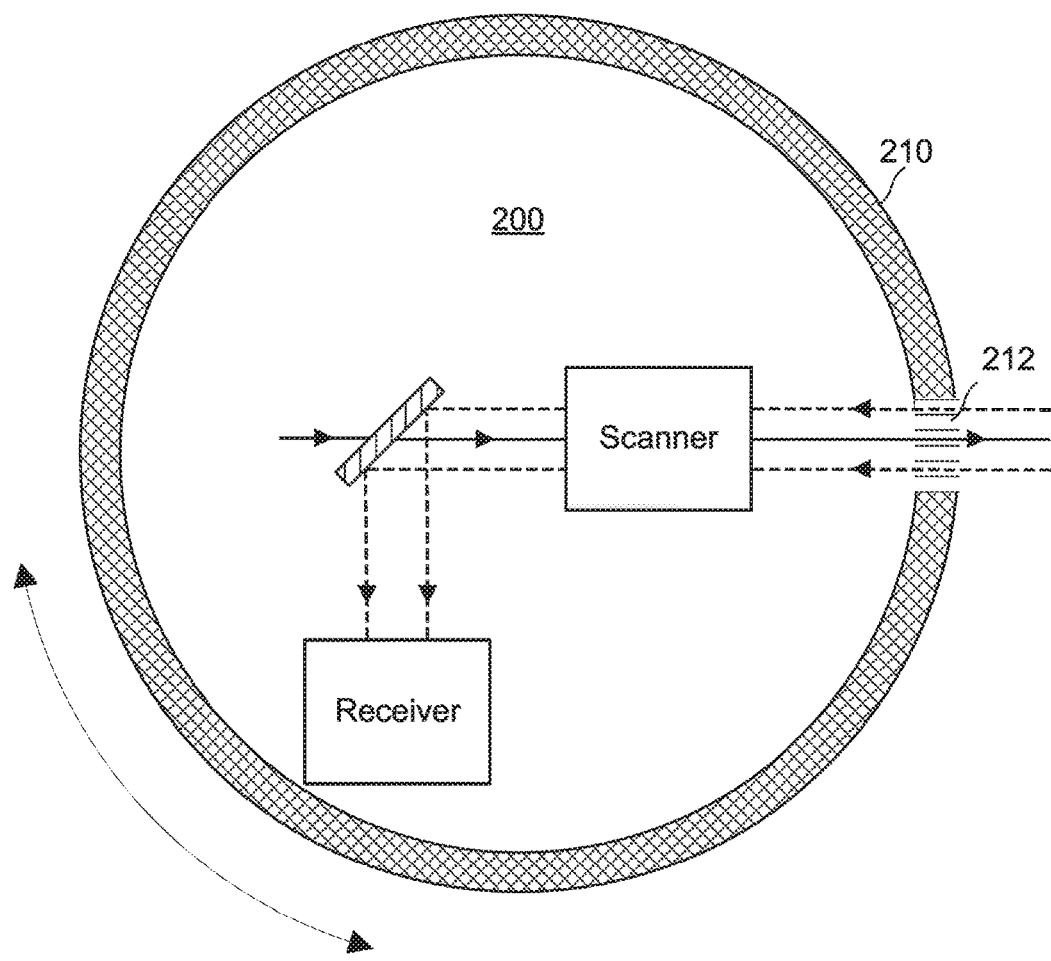
FIG. 3 illustrates an example configuration in which the components of FIG. 1 scan a 360-degree field of regard through a window in a rotating housing.
Figure 4:
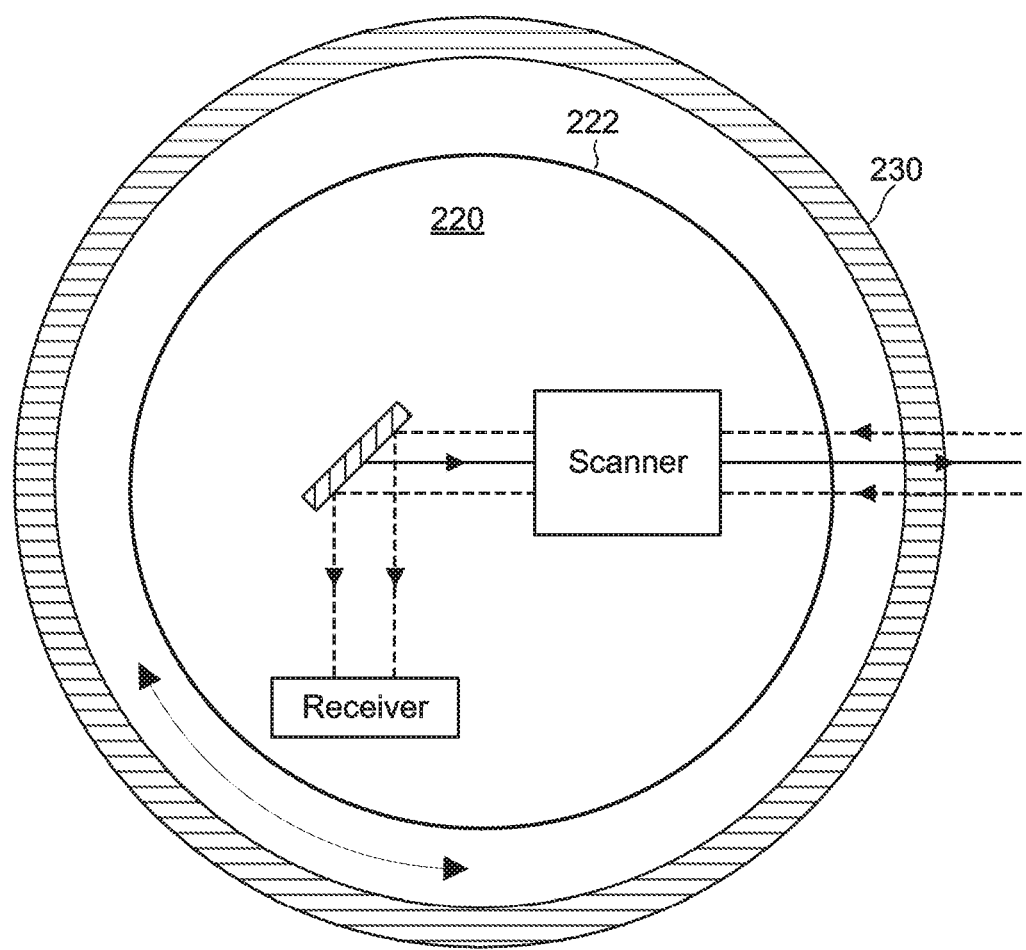
FIG. 4 illustrates another configuration in which the components of FIG. 1 scan a 360-degree field of regard through a substantially transparent stationary housing.
Figure 5:
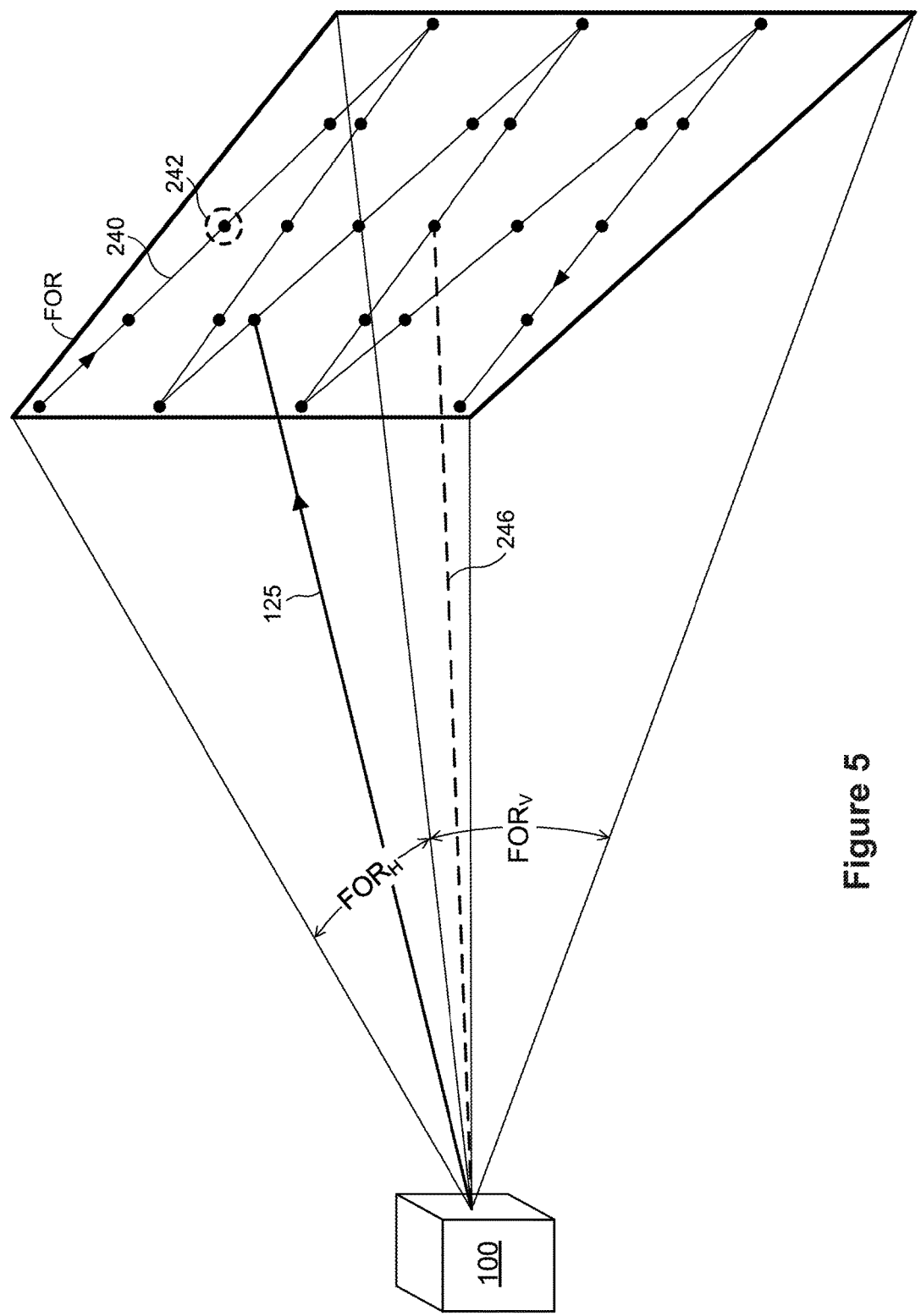
FIG. 5 illustrates an example scan pattern which the lidar system of FIG. 1 can produce when identifying targets within a field of regard.
Figure 6:
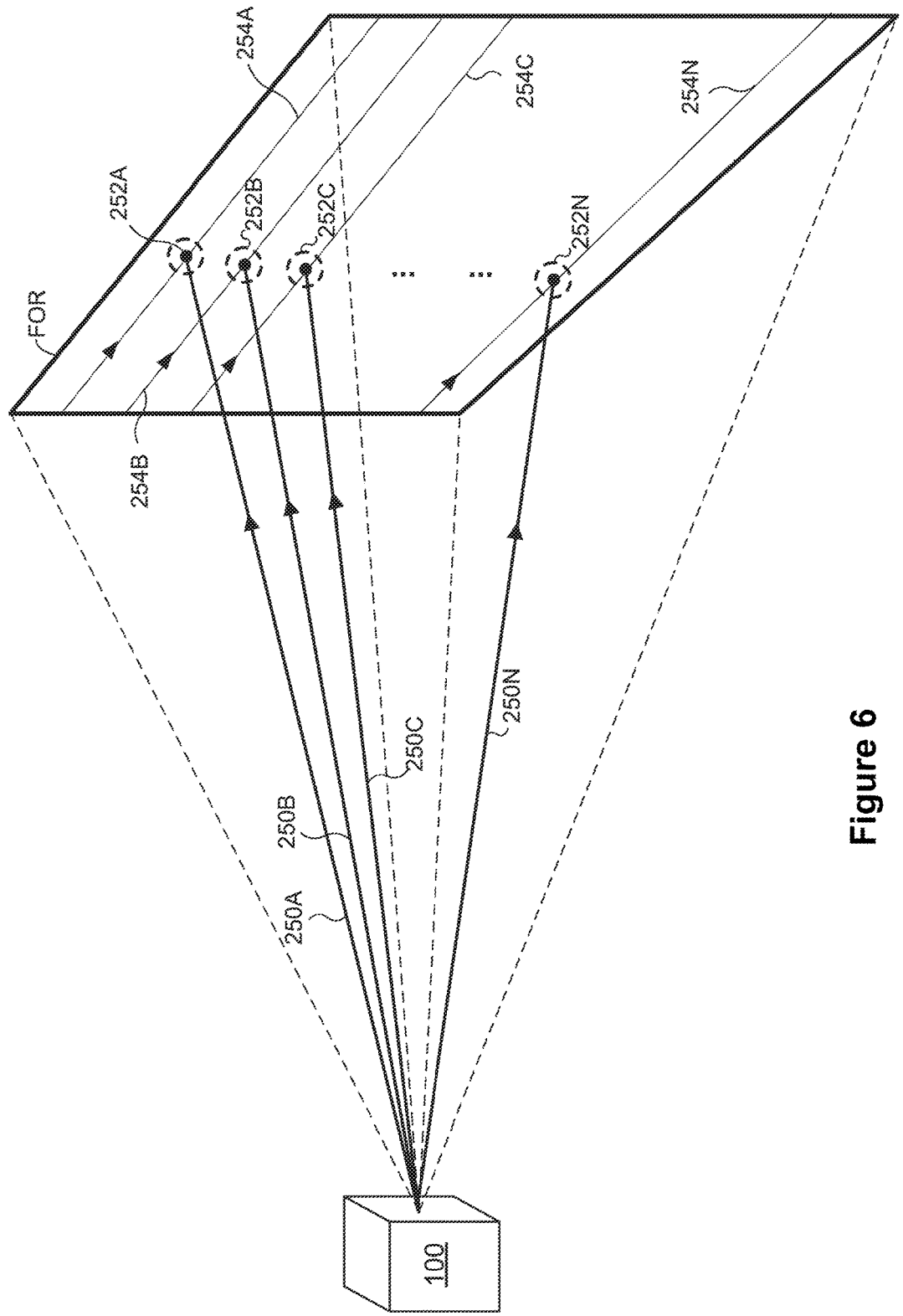
FIG. 6 illustrates an example scan pattern which the lidar system of FIG. 1 can produce when identifying targets within a field of regard using multiple beams.
Figure 7:
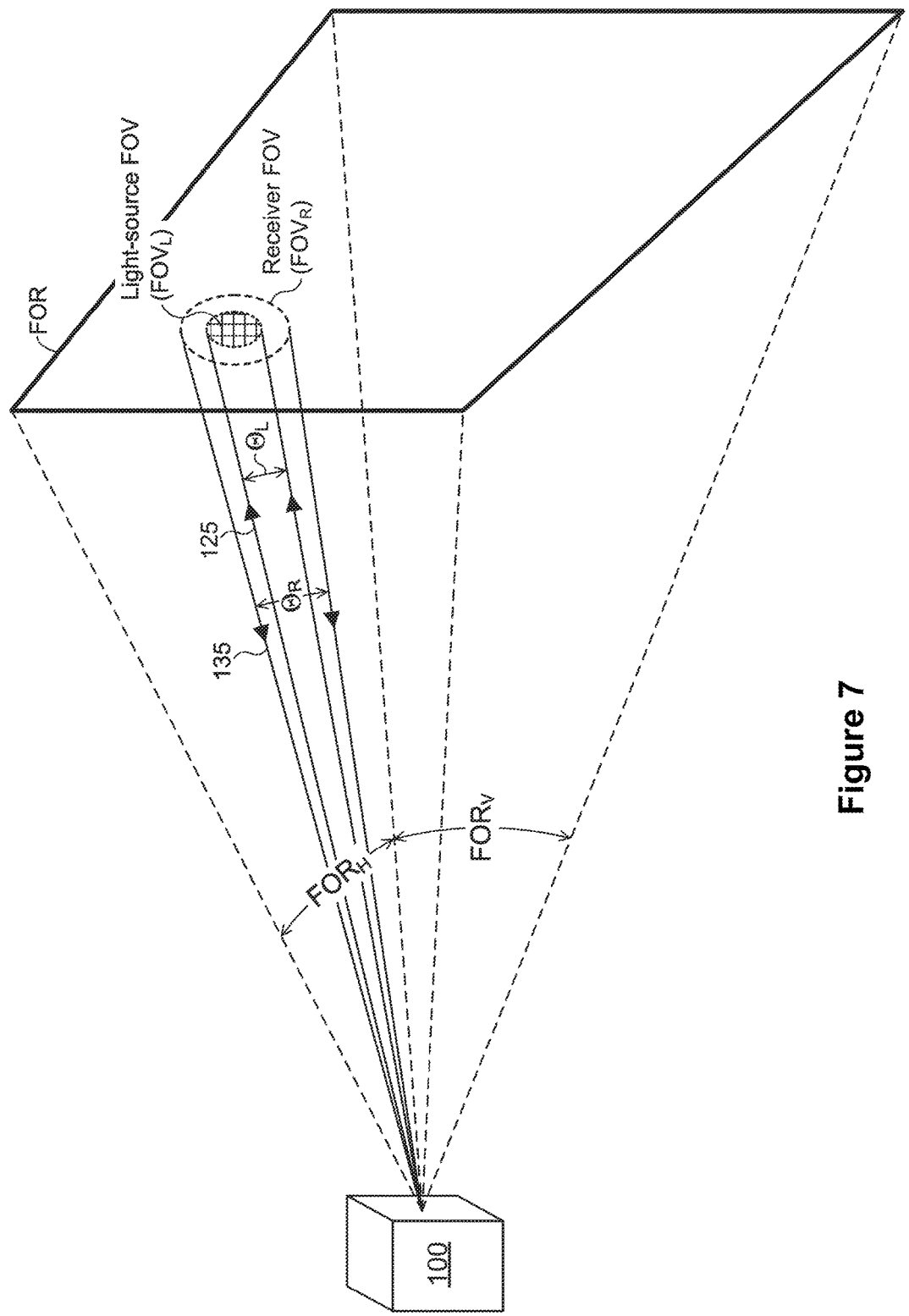
FIG. 7 schematically illustrates fields of view (FOVs) of a light source and a detector that can operate in the lidar system of FIG. 1.

An example lidar system in which these techniques can be implemented is considered next with reference to FIGS. 1-4, followed by a discussion of the techniques which the lidar system can implement to scan a field of regard and generate individual pixels (FIGS. 5-7). An example implementation in a vehicle is then discussed with reference to FIGS. 8 and 9. Then, an example photo detector and an example pulse-detection circuit are discussed with reference to FIGS. 10-12. Various techniques related to range walk compensation in a lidar system are discussed with reference to FIGS. 13-18.

System Overview

Figure 1:
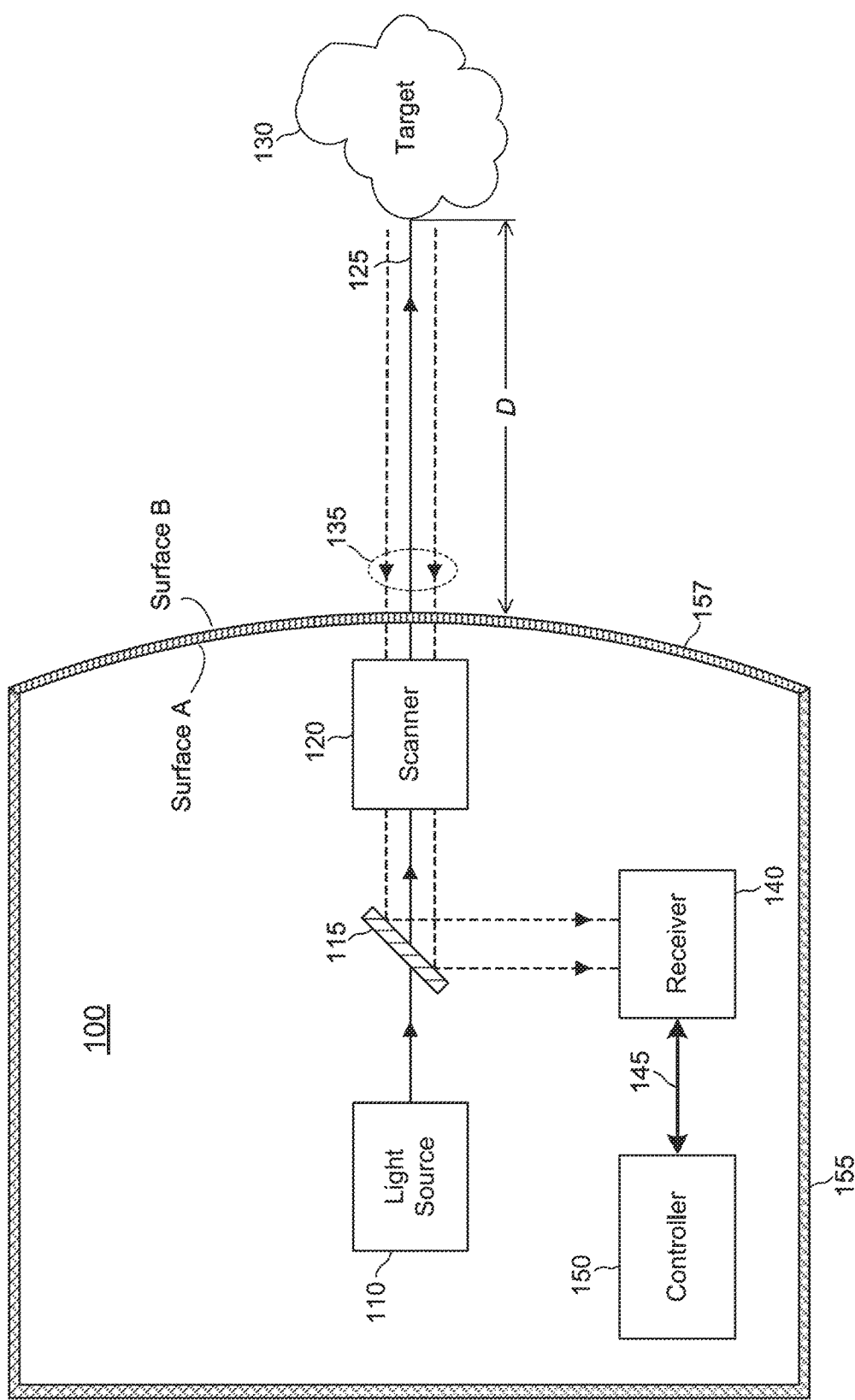
FIG. 1 is a block diagram of an example light detection and ranging (lidar) system in which the techniques of this disclosure can be implemented.

FIG. 1 illustrates an example light detection and ranging (lidar) system 100. The lidar system 100 may be referred to as a laser ranging system, a laser radar system, a LIDAR system, a lidar sensor, or a laser detection and ranging (LADAR or ladar) system. The lidar system 100 may include a light source 110, a mirror 115, a scanner 120, a receiver 140, and a controller 150. The light source 110 may be, for example, a laser which emits light having a particular operating wavelength in the infrared, visible, or ultraviolet portions of the electromagnetic spectrum. As a more specific example, the light source 110 may include a laser with an operating wavelength between approximately 1.2 μm and 1.7 μm.

In operation, the light source 110 emits an output beam of light 125 which may be continuous-wave, pulsed, or modulated in any suitable manner for a given application. The output beam of light 125 is directed downrange toward a remote target 130 located a distance D from the lidar system 100 and at least partially contained within a field of regard of the system 100. Depending on the scenario and/or the implementation of the lidar system 100, D can be between 1 m and 1 km, for example.

Once the output beam 125 reaches the downrange target 130, the target 130 may scatter or, in some cases, reflect at least a portion of light from the output beam 125, and some of the scattered or reflected light may return toward the lidar system 100. In the example of FIG. 1, the scattered or reflected light is represented by input beam 135, which passes through the scanner 120, which may be referred to as a beam scanner, optical scanner, or laser scanner. The input beam 135 passes through the scanner 120 to the mirror 115, which may be referred to as an overlap mirror, superposition mirror, or beam-combiner mirror. The mirror 115 in turn directs the input beam 135 to the receiver 140. The input 135 may contain only a relatively small fraction of the light from the output beam 125. For example, the ratio of average power, peak power, or pulse energy of the input beam 135 to average power, peak power, or pulse energy of the output beam 125 may be approximately $10^{-1}$, $10^{-2}$, $10^{-3}$, $10^{-4}$, $10^{-5}$, $10^{-6}$, $10^{-7}$, $10^{-8}$, $10^{-9}$, $10^{-10}$, $10^{-11}$, or $10^{-12}$. As another example, if a pulse of the output beam 125 has a pulse energy of 1 microjoule (μJ), then the pulse energy of a corresponding pulse of the input beam 135 may have a pulse energy of approximately 10 nanojoules (nJ), 1 nJ, 100 picojoules (pJ), 10 pJ, 1 pJ, 100 femtojoules (fJ), 10 fJ, 1 fJ, 100 attojoules (aJ), 10 aJ, or 1 aJ.

The output beam 125 may be referred to as a laser beam, light beam, optical beam, emitted beam, or just beam; and the input beam 135 may be referred to as a return beam, received beam, return light, received light, input light, scattered light, or reflected light. As used herein, scattered light may refer to light that is scattered or reflected by the target 130. The input beam 135 may include light from the output beam 125 that is scattered by the target 130, light from the output beam 125 that is reflected by the target 130, or a combination of scattered and reflected light from target 130.

The operating wavelength of a lidar system 100 may lie, for example, in the infrared, visible, or ultraviolet portions of the electromagnetic spectrum. The Sun also produces light in these wavelength ranges, and thus sunlight can act as background noise which can obscure signal light detected by the lidar system 100. This solar background noise can result in false-positive detections or can otherwise corrupt measurements of the lidar system 100, especially when the receiver 140 includes SPAD detectors (which can be highly sensitive).

Generally speaking, the light from the Sun that passes through the Earth's atmosphere and reaches a terrestrialbased lidar system such as the system 100 can establish an optical background noise floor for this system. Thus, in order for a signal from the lidar system 100 to be detectable, the signal must rise above the background noise floor. It is generally possible to increase the signal-to-noise (SNR) ratio of the lidar system 100 by raising the power level of the output beam 125, but in some situations it may be desirable to keep the power level of the output beam 125 relatively low. For example, increasing transmit power levels of the output beam 125 can result in the lidar system 100 not being eye-safe.

In some implementations, the lidar system 100 operates at one or more wavelengths between approximately 1400 nm and approximately 1600 nm. For example, the light source 110 may produce light at approximately 1550 nm.

In some implementations, the lidar system 100 operates at frequencies at which atmospheric absorption is relatively low. For example, the lidar system 100 can operate at wavelengths in the approximate ranges from 980 nm to 1110 nm or from 1165 nm to 1400 nm.

In other implementations, the lidar system 100 operates at frequencies at which atmospheric absorption is high. For example, the lidar system 100 can operate at wavelengths in the approximate ranges from 930 nm to 980 nm, from 1100 nm to 1165 nm, or from 1400 nm to 1460 nm.

According to some implementations, the lidar system 100 can include an eye-safe laser, or the lidar system 100 can be classified as an eye-safe laser system or laser product. An eye-safe laser, laser system, or laser product may refer to a system with an emission wavelength, average power, peak power, peak intensity, pulse energy, beam size, beam divergence, exposure time, or scanned output beam such that emitted light from the system presents little or no possibility of causing damage to a person's eyes. For example, the light source 110 or lidar system 100 may be classified as a Class 1 laser product (as specified by the 60825-1 standard of the International Electrotechnical Commission (IEC)) or a Class I laser product (as specified by Title 21, Section 1040.10 of the United States Code of Federal Regulations (CFR)) that is safe under all conditions of normal use. In some implementations, the lidar system 100 may be classified as an eye-safe laser product (e.g., with a Class 1 or Class I classification) configured to operate at any suitable wavelength between approximately 1400 nm and approximately 2100 nm. In some implementations, the light source 110 may include a laser with an operating wavelength between approximately 1400 nm and approximately 1600 nm, and the lidar system 100 may be operated in an eye-safe manner. In some implementations, the light source 110 or the lidar system 100 may be an eye-safe laser product that includes a scanned laser with an operating wavelength between approximately 1530 nm and approximately 1560 nm. In some implementations, the lidar system 100 may be a Class 1 or Class I laser product that includes a fiber laser or solid-state laser with an operating wavelength between approximately 1400 nm and approximately 1600 nm.

The receiver 140 may receive or detect photons from the input beam 135 and generate one or more representative signals. For example, the receiver 140 may generate an output electrical signal 145 that is representative of the input beam 135. The receiver may send the electrical signal 145 to the controller 150. Depending on the implementation, the controller 150 may include one or more processors, an application-specific integrated circuit (ASIC), a field-programmable gate array (FPGA), and/or other suitable circuitry configured to analyze one or more characteristics of the electrical signal 145 to determine one or more characteristics of the target 130, such as its distance downrange from the lidar system 100. More particularly, the controller 150 may analyze the time of flight or phase modulation for the beam of light 125 transmitted by the light source 110. If the lidar system 100 measures a time of flight of T (e.g., T represents a round-trip time of flight for an emitted pulse of light to travel from the lidar system 100 to the target 130 and back to the lidar system 100), then the distance D from the target 130 to the lidar system 100 may be expressed as $D = c \cdot T/2$, where c is the speed of light (approximately $3.0 \times 10^8$ m/s).

As a more specific example, if the lidar system 100 measures the time of flight to be T=300 ns, then the lidar system 100 can determine the distance from the target 130 to the lidar system 100 to be approximately D=45.0 m. As another example, the lidar system 100 measures the time of flight to be T=1.33 μs and accordingly determines that the distance from the target 130 to the lidar system 100 is approximately D=199.5 m. The distance D from lidar system 100 to the target 130 may be referred to as a distance, depth, or range of the target 130. As used herein, the speed of light c refers to the speed of light in any suitable medium, such as for example in air, water, or vacuum. The speed of light in vacuum is approximately $2.9979 \times 10^8$ m/s, and the speed of light in air (which has a refractive index of approximately 1.0003) is approximately $2.9970 \times 10^8$ m/s.

The target 130 may be located a distance D from the lidar system 100 that is less than or equal to a maximum range $R_{MAX}$ of the lidar system 100. The maximum range $R_{MAX}$ (which also may be referred to as a maximum distance) of a lidar system 100 may correspond to the maximum distance over which the lidar system 100 is configured to sense or identify targets that appear in a field of regard of the lidar system 100. The maximum range of lidar system 100 may be any suitable distance, such as for example, 25 m, 50 m, 100 m, 200 m, 500 m, or 1 km. As a specific example, a lidar system with a 200-m maximum range may be configured to sense or identify various targets located up to 200 m away. For a lidar system with a 200-m maximum range ($R_{MAX}$=200 m), the time of flight corresponding to the maximum range is approximately $2 \cdot R_{MAX}/c \approx 1.33$ μs.

In some implementations, the light source 110, the scanner 120, and the receiver 140 may be packaged together within a single housing 155, which may be a box, case, or enclosure that holds or contains all or part of a lidar system 100. The housing 155 includes a window 157 through which the beams 125 and 135 pass. In one example implementation, the lidar-system housing 155 contains the light source 110, the overlap mirror 115, the scanner 120, and the receiver 140 of a lidar system 100. The controller 150 may reside within the same housing 155 as the components 110, 120, and 140, or the controller 150 may reside remotely from the housing 155.

Moreover, in some implementations, the housing 155 includes multiple lidar sensors, each including a respective scanner and a receiver. Depending on the particular implementation, each of the multiple sensors can include a separate light source or a common light source. The multiple sensors can be configured to cover non-overlapping adjacent fields of regard or partially overlapping fields of regard, depending on the implementation.

The housing 155 may be an airtight or watertight structure that prevents water vapor, liquid water, dirt, dust, or other contaminants from getting inside the housing 155. The housing 155 may be filled with a dry or inert gas, such as for example dry air, nitrogen, or argon. The housing 155 may include one or more electrical connections for conveying electrical power or electrical signals to and/or from the housing.

The window 157 may be made from any suitable substrate material, such as for example, glass or plastic (e.g., polycarbonate, acrylic, cyclic-olefin polymer, or cyclic-olefin copolymer). The window 157 may include an interior surface (surface A) and an exterior surface (surface B), and surface A or surface B may include a dielectric coating having particular reflectivity values at particular wavelengths. A dielectric coating (which may be referred to as a thin-film coating, interference coating, or coating) may include one or more thin-film layers of dielectric materials (e.g., $SiO_2$, $TiO_2$, $Al_2O_3$, $Ta_2O_5$, $MgF_2$, $LaF_3$, or $AlF_3$) having particular thicknesses (e.g., thickness less than 1 μm) and particular refractive indices. A dielectric coating may be deposited onto surface A or surface B of the window 157 using any suitable deposition technique, such as for example, sputtering or electron-beam deposition.

The dielectric coating may have a high reflectivity at a particular wavelength or a low reflectivity at a particular wavelength. A high-reflectivity (HR) dielectric coating may have any suitable reflectivity value (e.g., a reflectivity greater than or equal to 80%, 90%, 95%, or 99%) at any suitable wavelength or combination of wavelengths. A low-reflectivity dielectric coating (which may be referred to as an anti-reflection (AR) coating) may have any suitable reflectivity value (e.g., a reflectivity less than or equal to 5%, 2%, 1%, 0.5%, or 0.2%) at any suitable wavelength or combination of wavelengths. In particular embodiments, a dielectric coating may be a dichroic coating with a particular combination of high or low reflectivity values at particular wavelengths. For example, a dichroic coating may have a reflectivity of less than or equal to 0.5% at approximately 1550-1560 nm and a reflectivity of greater than or equal to 90% at approximately 800-1500 nm.

In some implementations, surface A or surface B has a dielectric coating that is anti-reflecting (AR) at an operating wavelength of one or more light sources 110 contained within enclosure 155. An AR coating on surface A and surface B may increase the amount of light at an operating wavelength of the light source 110 that is transmitted through the window 157. Additionally, an AR coating at an operating wavelength of the light source 110 may reduce the amount of incident light from output beam 125 that is reflected by the window 157 back into the housing 155. In an example implementation, each of surface A and surface B has an AR coating with reflectivity less than 0.5% at an operating wavelength of light source 110. As an example, if the light source 110 has an operating wavelength of approximately 1550 nm, then surface A and surface B may each have an AR coating with a reflectivity that is less than 0.5% from approximately 1547 nm to approximately 1553 nm. In another implementation, each of surface A and surface B has an AR coating with reflectivity less than 1% at the operating wavelengths of the light source 110. For example, if the housing 155 encloses two sensor heads with respective light sources, the first light source emits pulses at a wavelength of approximately 1535 nm and the second light source emits pulses at a wavelength of approximately 1540 nm, then surface A and surface B may each have an AR coating with reflectivity less than 1% from approximately 1530 nm to approximately 1545 nm.

The window 157 may have an optical transmission that is greater than any suitable value for one or more wavelengths of one or more light sources 110 contained within the housing 155. As an example, the window 157 may have an optical transmission of greater than or equal to 70%, 80%, 90%, 95%, or 99% at a wavelength of light source 110. In one example implementation, the window 157 can transmit greater than or equal to 95% of light at an operating wavelength of the light source 110. In another implementation, the window 157 transmits greater than or equal to 90% of light at the operating wavelengths of the light sources enclosed within the housing 155.

Surface A or surface B may have a dichroic coating that is anti-reflecting at one or more operating wavelengths of one or more light sources 110 and high-reflecting at wavelengths away from the one or more operating wavelengths. For example, surface A may have an AR coating for an operating wavelength of the light source 110, and surface B may have a dichroic coating that is AR at the light-source operating wavelength and HR for wavelengths away from the operating wavelength. A coating that is HR for wavelengths away from a light-source operating wavelength may prevent most incoming light at unwanted wavelengths from being transmitted through the window 117. In one implementation, if the light source 110 emits optical pulses with a wavelength of approximately 1550 nm, then surface A may have an AR coating with a reflectivity of less than or equal to 0.5% from approximately 1546 nm to approximately 1554 nm. Additionally, surface B may have a dichroic coating that is AR at approximately 1546-1554 nm and HR (e.g., reflectivity of greater than or equal to 90%) at approximately 800-1500 nm and approximately 1580-1700 nm.

Surface B of the window 157 may include a coating that is oleophobic, hydrophobic, or hydrophilic. A coating that is oleophobic (or, lipophobic) may repel oils (e.g., fingerprint oil or other non-polar material) from the exterior surface (surface B) of the window 157. A coating that is hydrophobic may repel water from the exterior surface. For example, surface B may be coated with a material that is both oleophobic and hydrophobic. A coating that is hydrophilic attracts water so that water may tend to wet and form a film on the hydrophilic surface (rather than forming beads of water as may occur on a hydrophobic surface). If surface B has a hydrophilic coating, then water (e.g., from rain) that lands on surface B may form a film on the surface. The surface film of water may result in less distortion, deflection, or occlusion of an output beam 125 than a surface with a non-hydrophilic coating or a hydrophobic coating.

With continued reference to FIG. 1, the light source 110 may include a pulsed laser or a pulsed light-emitting diode (LED) configured to produce or emit pulses of light with a certain pulse duration. In an example implementation, the pulse duration or pulse width of the pulsed laser is approximately 10 picoseconds (ps) to 20 nanoseconds (ns). In another implementation, the light source 110 is a pulsed laser that produces pulses with a pulse duration of approximately 1-4 ns. In yet another implementation, the light source 110 is a pulsed laser that produces pulses at a pulse repetition frequency of approximately 100 kHz to 5 MHz or a pulse period (e.g., a time between consecutive pulses) of approximately 200 ns to 10 μs. The light source 110 may have a substantially constant or a variable pulse repetition frequency, depending on the implementation. As an example, the light source 110 may be a pulsed laser that produces pulses at a substantially constant pulse repetition frequency of approximately 640 kHz (e.g., 640,000 pulses per second), corresponding to a pulse period of approximately 1.56 μs. As another example, the light source 110 may have a pulse repetition frequency that can be varied from approximately 500 kHz to 3 MHz. As used herein, a pulse of light may be referred to as an optical pulse, a light pulse, or a pulse, and a pulse repetition frequency may be referred to as a pulse rate.

In general, the output beam 125 may have any suitable average optical power, and the output beam 125 may include optical pulses with any suitable pulse energy or peak optical power. Some examples of the average power of the output beam 125 include the approximate values of 1 mW, 10 mW, 100 mW, 1 W, and 10 W. Example values of pulse energy of the output beam 125 include the approximate values of 0.1 µJ, 1 µJ, 10 µJ, 100 µJ, and 1 mJ. Examples of peak power values of pulses included in the output beam 125 are the approximate values of 10 W, 100 W, 1 kW, 5 kW, 10 kW. An example optical pulse with a duration of 1 ns and a pulse energy of 1 µJ has a peak power of approximately 1 kW. If the pulse repetition frequency is 500 kHz, then the average power of the output beam 125 with 1-0 pulses is approximately 0.5 W, in this example.

The light source 110 may include a laser diode, such as a Fabry-Perot laser diode, a quantum well laser, a distributed Bragg reflector (DBR) laser, a distributed feedback (DFB) laser, or a vertical-cavity surface-emitting laser (VCSEL). The laser diode operating in the light source 110 may be an aluminum-gallium-arsenide (AlGaAs) laser diode, an indium-gallium-arsenide (InGaAs) laser diode, or an indium-gallium-arsenide-phosphide (InGaAsP) laser diode, or any other suitable diode. In some implementations, the light source 110 includes a pulsed laser diode with a peak emission wavelength of approximately 1400-1600 nm. Further, the light source 110 may include a laser diode that is current-modulated to produce optical pulses.

In some implementation, the light source 110 includes a pulsed laser diode followed by one or more optical-amplification stages. For example, the light source 110 may be a fiber-laser module that includes a current-modulated laser diode with a peak wavelength of approximately 1550 nm, followed by a single-stage or a multi-stage erbium-doped fiber amplifier (EDFA). As another example, the light source 110 may include a continuous-wave (CW) or quasi-CW laser diode followed by an external optical modulator (e.g., an electro-optic modulator), and the output of the modulator may be fed into an optical amplifier. In yet other implementations, the light source 110 may include a pulsed solid-state laser or a pulsed fiber laser.

In some implementations, the output beam of light 125 emitted by the light source 110 is a collimated optical beam with any suitable beam divergence, such as a divergence of approximately 0.1 to 3.0 milliradian (mrad). Divergence of the output beam 125 may refer to an angular measure of an increase in beam size (e.g., a beam radius or beam diameter) as the output beam 125 travels away from the light source 110 or the lidar system 100. The output beam 125 may have a substantially circular cross section with a beam divergence characterized by a single divergence value. For example, the output beam 125 with a circular cross section and a divergence of 1 mrad may have a beam diameter or spot size of approximately 10 cm at a distance of 100 m from the lidar system 100. In some implementations, the output beam 125 may be an astigmatic beam or may have a substantially elliptical cross section and may be characterized by two divergence values. As an example, the output beam 125 may have a fast axis and a slow axis, where the fast-axis divergence is greater than the slow-axis divergence. As another example, the output beam 125 may be an astigmatic beam with a fast-axis divergence of 2 mrad and a slow-axis divergence of 0.5 mrad.

The output beam of light 125 emitted by light source 110 may be unpolarized or randomly polarized, may have no specific or fixed polarization (e.g., the polarization may vary with time), or may have a particular polarization (e.g., the output beam 125 may be linearly polarized, elliptically polarized, or circularly polarized). As an example, the light source 110 may produce linearly polarized light, and the lidar system 100 may include a quarter-wave plate that converts this linearly polarized light into circularly polarized light. The lidar system 100 may transmit the circularly polarized light as the output beam 125, and receive the input beam 135, which may be substantially or at least partially circularly polarized in the same manner as the output beam 125 (e.g., if the output beam 125 is right-hand circularly polarized, then the input beam 135 may also be right-hand circularly polarized). The input beam 135 may pass through the same quarter-wave plate (or a different quarter-wave plate), resulting in the input beam 135 being converted to linearly polarized light which is orthogonally polarized (e.g., polarized at a right angle) with respect to the linearly polarized light produced by light source 110. As another example, the lidar system 100 may employ polarization-diversity detection where two polarization components are detected separately. The output beam 125 may be linearly polarized, and the lidar system 100 may split the input beam 135 into two polarization components (e.g., s-polarization and p-polarization) which are detected separately by two photodiodes (e.g., a balanced photoreceiver that includes two photodiodes).

With continued reference to FIG. 1, the output beam 125 and input beam 135 may be substantially coaxial. In other words, the output beam 125 and input beam 135 may at least partially overlap or share a common propagation axis, so that the input beam 135 and the output beam 125 travel along substantially the same optical path (albeit in opposite directions). As the lidar system 100 scans the output beam 125 across a field of regard, the input beam 135 may follow along with the output beam 125, so that the coaxial relationship between the two beams is maintained.

The lidar system 100 also may include one or more optical components configured to condition, shape, filter, modify, steer, or direct the output beam 125 and/or the input beam 135. For example, lidar system 100 may include one or more lenses, mirrors, filters (e.g., bandpass or interference filters), beam splitters, polarizers, polarizing beam splitters, wave plates (e.g., half-wave or quarter-wave plates), diffractive elements, or holographic elements. In some implementations, lidar system 100 includes a telescope, one or more lenses, or one or more mirrors to expand, focus, or collimate the output beam 125 to a desired beam diameter or divergence. As an example, the lidar system 100 may include one or more lenses to focus the input beam 135 onto an active region of the receiver 140. As another example, the lidar system 100 may include one or more flat mirrors or curved mirrors (e.g., concave, convex, or parabolic mirrors) to steer or focus the output beam 125 or the input beam 135. For example, the lidar system 100 may include an off-axis parabolic mirror to focus the input beam 135 onto an active region of receiver 140. As illustrated in FIG. 1, the lidar system 100 may include the mirror 115, which may be a metallic or dielectric mirror. The mirror 115 may be configured so that the light beam 125 passes through the mirror 115. As an example, mirror 115 may include a hole, slot, or aperture through which the output light beam 125 passes. As another example, the mirror 115 may be configured so that at least 80% of the output beam 125 passes through the mirror 115 and at least 80% of the input beam 135 is reflected by the mirror 115. In some implementations, the mirror 115 may provide for the output beam 125 and the input beam 135 to be substantially coaxial, so that the beams 125 and 135 travel along substantially the same optical path, in opposite directions.

Generally speaking, the scanner 120 steers the output beam 125 in one or more directions downrange. The scanner 120 may include one or more scanning mirrors and one or more actuators driving the mirrors to rotate, tilt, pivot, or move the mirrors in an angular manner about one or more axes, for example. For example, the first mirror of the scanner may scan the output beam 125 along a first direction, and the second mirror may scan the output beam 125 along a second direction that is substantially orthogonal to the first direction. Example implementations of the scanner 120 are discussed in more detail below with reference to FIG. 2.

The scanner 120 may be configured to scan the output beam 125 over a 5-degree angular range, 20-degree angular range, 30-degree angular range, 60-degree angular range, or any other suitable angular range. For example, a scanning mirror may be configured to periodically rotate over a 15-degree range, which results in the output beam 125 scanning across a 30-degree range (e.g., a Θ-degree rotation by a scanning mirror results in a 2Θ-degree angular scan of the output beam 125). A field of regard (FOR) of the lidar system 100 may refer to an area, region, or angular range over which the lidar system 100 may be configured to scan or capture distance information. When the lidar system 100 scans the output beam 125 within a 30-degree scanning range, the lidar system 100 may be referred to as having a 30-degree angular field of regard. As another example, a lidar system 100 with a scanning mirror that rotates over a 30-degree range may produce the output beam 125 that scans across a 60-degree range (e.g., a 60-degree FOR). In various implementations, the lidar system 100 may have a FOR of approximately 10°, 20°, 40°, 60°, 120°, or any other suitable FOR. The FOR also may be referred to as a scan region.

The scanner 120 may be configured to scan the output beam 125 horizontally and vertically, and the lidar system 100 may have a particular FOR along the horizontal direction and another particular FOR along the vertical direction. For example, the lidar system 100 may have a horizontal FOR of 10° to 120° and a vertical FOR of 2° to 45°.

The one or more scanning mirrors of the scanner 120 may be communicatively coupled to the controller 150 which may control the scanning mirror(s) so as to guide the output beam 125 in a desired direction downrange or along a desired scan pattern. In general, a scan pattern may refer to a pattern or path along which the output beam 125 is directed, and also may be referred to as an optical scan pattern, optical scan path, or scan path. As an example, the scanner 120 may include two scanning mirrors configured to scan the output beam 125 across a 60° horizontal FOR and a 20° vertical FOR. The two scanner mirrors may be controlled to follow a scan path that substantially covers the 60°×20° FOR. The lidar system 100 can use the scan path to generate a point cloud with pixels that substantially cover the 60°×20° FOR. The pixels may be approximately evenly distributed across the 60°×20° FOR. Alternately, the pixels may have a particular non-uniform distribution (e.g., the pixels may be distributed across all or a portion of the 60°×20° FOR, and the pixels may have a higher density in one or more particular regions of the 60°×20° FOR).

In operation, the light source 110 may emit pulses of light which the scanner 120 scans across a FOR of lidar system 100. The target 130 may scatter one or more of the emitted pulses, and the receiver 140 may detect at least a portion of the pulses of light scattered by the target 130.

The receiver 140 may be referred to as (or may include) a photoreceiver, optical receiver, optical sensor, detector, photodetector, or optical detector. The receiver 140 in some implementations receives or detects at least a portion of the input beam 135 and produces an electrical signal that corresponds to the input beam 135. For example, if the input beam 135 includes an optical pulse, then the receiver 140 may produce an electrical current or voltage pulse that corresponds to the optical pulse detected by the receiver 140. In an example implementation, the receiver 140 includes one or more avalanche photodiodes (APDs) or one or more single-photon avalanche diodes (SPADs). In another implementation, the receiver 140 includes one or more PN photodiodes (e.g., a photodiode structure formed by a p-type semiconductor and a n-type semiconductor) or one or more PIN photodiodes (e.g., a photodiode structure formed by an undoped intrinsic semiconductor region located between p-type and n-type regions).

The receiver 140 may have an active region or an avalanche-multiplication region that includes silicon, germanium, or InGaAs. The active region of receiver 140 may have any suitable size, such as for example, a diameter or width of approximately 50-500 μm. The receiver 140 may include circuitry that performs signal amplification, sampling, filtering, signal conditioning, analog-to-digital conversion, time-to-digital conversion, pulse detection, threshold detection, rising-edge detection, or falling-edge detection. For example, the receiver 140 may include a transimpedance amplifier that converts a received photocurrent (e.g., a current produced by an APD in response to a received optical signal) into a voltage signal. The receiver 140 may direct the voltage signal to pulse-detection circuitry that produces an analog or digital output signal 145 that corresponds to one or more characteristics (e.g., rising edge, falling edge, amplitude, or duration) of a received optical pulse. For example, the pulse-detection circuitry may perform a time-to-digital conversion to produce a digital output signal 145. The receiver 140 may send the electrical output signal 145 to the controller 150 for processing or analysis, e.g., to determine a time-of-flight value corresponding to a received optical pulse.

The controller 150 may be electrically coupled or otherwise communicatively coupled to one or more of the light source 110, the scanner 120, and the receiver 140. The controller 150 may receive electrical trigger pulses or edges from the light source 110, where each pulse or edge corresponds to the emission of an optical pulse by the light source 110. The controller 150 may provide instructions, a control signal, or a trigger signal to the light source 110 indicating when the light source 110 should produce optical pulses. For example, the controller 150 may send an electrical trigger signal that includes electrical pulses, where the light source 110 emits an optical pulse in response to each electrical pulse. Further, the controller 150 may cause the light source 110 to adjust one or more of the frequency, period, duration, pulse energy, peak power, average power, or wavelength of the optical pulses produced by light source 110.

The controller 150 may determine a time-of-flight value for an optical pulse based on timing information associated with when the pulse was emitted by light source 110 and when a portion of the pulse (e.g., the input beam 135) was detected or received by the receiver 140. The controller 150 may include circuitry that performs signal amplification, sampling, filtering, signal conditioning, analog-to-digital conversion, time-to-digital conversion, pulse detection, threshold detection, rising-edge detection, or falling-edge detection.

As indicated above, the lidar system 100 may be used to determine the distance to one or more downrange targets 130. By scanning the lidar system 100 across a field of regard, the system can be used to map the distance to a number of points within the field of regard. Each of these depth-mapped points may be referred to as a pixel or a voxel. A collection of pixels captured in succession (which may be referred to as a depth map, a point cloud, or a frame) may be rendered as an image or may be analyzed to identify or detect objects or to determine a shape or distance of objects within the FOR. For example, a depth map may cover a field of regard that extends 60° horizontally and 15° vertically, and the depth map may include a frame of 100-2000 pixels in the horizontal direction by 4-400 pixels in the vertical direction.

The lidar system 100 may be configured to repeatedly capture or generate point clouds of a field of regard at any suitable frame rate between approximately 0.1 frames per second (FPS) and approximately 1,000 FPS. For example, the lidar system 100 may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. In an example implementation, the lidar system 100 is configured to produce optical pulses at a rate of $5\times10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). The point-cloud frame rate may be substantially fixed or dynamically adjustable, depending on the implementation. For example, the lidar system 100 may capture one or more point clouds at a particular frame rate (e.g., 1 Hz) and then switch to capture one or more point clouds at a different frame rate (e.g., 10 Hz). In general, the lidar system can use a slower frame rate (e.g., 1 Hz) to capture one or more high-resolution point clouds, and use a faster frame rate (e.g., 10 Hz) to rapidly capture multiple lower-resolution point clouds.

The field of regard of the lidar system 100 can overlap, encompass, or enclose at least a portion of the target 130, which may include all or part of an object that is moving or that is stationary relative to lidar system 100. For example, the target 130 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects.

Figure 2:
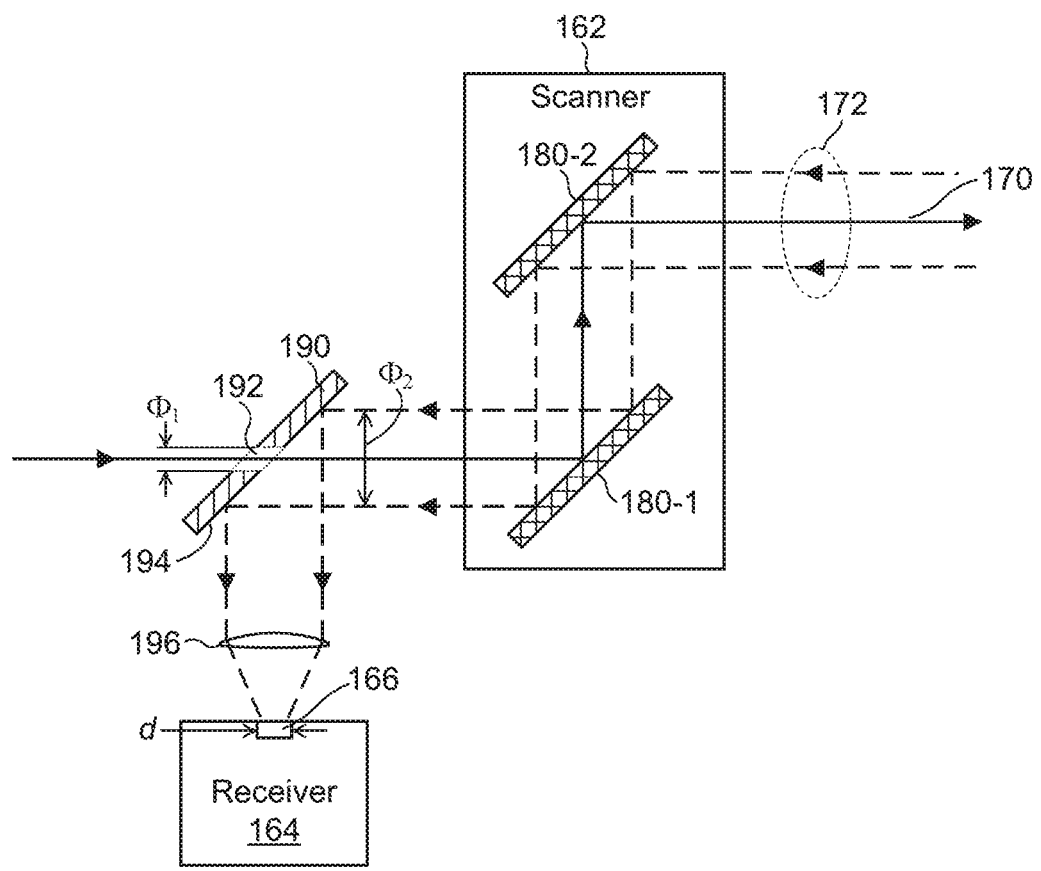
FIG. 2 illustrates in more detail several components that can operate in the system of FIG. 1.

Now referring to FIG. 2, a scanner 162 and a receiver 164 can operate in the lidar system of FIG. 1 as the scanner 120 and the receiver 140, respectively. More generally, the scanner 162 and the receiver 164 can operate in any suitable lidar system.

The scanner 162 may include any suitable number of mirrors driven by any suitable number of mechanical actuators. For example, the scanner 162 may include a galvanometer scanner, a resonant scanner, a piezoelectric actuator, a polygonal scanner, a rotating-prism scanner, a voice coil motor, a DC motor, a brushless motor, a stepper motor, or a microelectromechanical systems (MEMS) device, or any other suitable actuator or mechanism.

A galvanometer scanner (which also may be referred to as a galvanometer actuator) may include a galvanometer-based scanning motor with a magnet and coil. When an electrical current is supplied to the coil, a rotational force is applied to the magnet, which causes a mirror attached to the galvanometer scanner to rotate. The electrical current supplied to the coil may be controlled to dynamically change the position of the galvanometer mirror. A resonant scanner (which may be referred to as a resonant actuator) may include a spring-like mechanism driven by an actuator to produce a periodic oscillation at a substantially fixed frequency (e.g., 1 kHz). A MEMS-based scanning device may include a mirror with a diameter between approximately 1 and 10 mm, where the mirror is rotated using electromagnetic or electrostatic actuation. A voice coil motor (which may be referred to as a voice coil actuator) may include a magnet and a coil. When an electrical current is supplied to the coil, a translational force is applied to the magnet, which causes a mirror attached to the magnet to move or rotate.

In an example implementation, the scanner 162 includes a single mirror configured to scan an output beam 170 along a single direction (e.g., the scanner 162 may be a one-dimensional scanner that scans along a horizontal or vertical direction). The mirror may be a flat scanning mirror attached to a scanner actuator or mechanism which scans the mirror over a particular angular range. The mirror may be driven by one actuator (e.g., a galvanometer) or two actuators configured to drive the mirror in a push-pull configuration. When two actuators drive the mirror in one direction in a push-pull configuration, the actuators may be located at opposite ends or sides of the mirror. The actuators may operate in a cooperative manner so that when one actuator pushes on the mirror, the other actuator pulls on the mirror, and vice versa. In another example implementation, two voice coil actuators arranged in a push-pull configuration drive a mirror along a horizontal or a vertical direction.

In some implementations, the scanner 162 may include one mirror configured to be scanned along two axes, where two actuators arranged in a push-pull configuration provide motion along each axis. For example, two resonant actuators arranged in a horizontal push-pull configuration may drive the mirror along a horizontal direction, and another pair of resonant actuators arranged in a vertical push-pull configuration may drive mirror along a vertical direction. In another example implementation, two actuators scan the output beam 170 along two directions (e.g., horizontal and vertical), where each actuator provides rotational motion along a particular direction or about a particular axis.

The scanner 162 also may include one mirror driven by two actuators configured to scan the mirror along two substantially orthogonal directions. For example, a resonant actuator or a galvanometer actuator may drive one mirror along a substantially horizontal direction, and a galvanometer actuator may drive the mirror along a substantially vertical direction. As another example, two resonant actuators may drive a mirror along two substantially orthogonal directions.

In some implementations, the scanner 162 includes two mirrors, where one mirror scans the output beam 170 along a substantially horizontal direction and the other mirror scans the output beam 170 along a substantially vertical direction. In the example of FIG. 2, the scanner 162 includes two mirrors, a mirror 180-1 and a mirror 180-2. The mirror 180-1 may scan the output beam 170 along a substantially horizontal direction, and the mirror 180-2 may scan the output beam 170 along a substantially vertical direction (or vice versa). Mirror 180-1 or mirror 180-2 may be a flat mirror, a curved mirror, or a polygon mirror with two or more reflective surfaces.

The scanner 162 in other implementations includes two galvanometer scanners driving respective mirrors. For example, the scanner 162 may include a galvanometer actuator that scans the mirror 180-1 along a first direction (e.g., vertical), and the scanner 162 may include another galvanometer actuator that scans the mirror 180-2 along a second direction (e.g., horizontal). In yet another implementation, the scanner 162 includes two mirrors, where a galvanometer actuator drives one mirror, and a resonant actuator drives the other mirror. For example, a galvanometer actuator may scan the mirror 180-1 along a first direction, and a resonant actuator may scan the mirror 180-2 along a second direction. The first and second scanning directions may be substantially orthogonal to one another, e.g., the first direction may be substantially vertical, and the second direction may be substantially horizontal. In yet another implementation, the scanner 162 includes two mirrors, where one mirror is a polygon mirror that is rotated in one direction (e.g., clockwise or counter-clockwise) by an electric motor (e.g., a brushless DC motor). For example, mirror 180-1 may be a polygon mirror that scans the output beam 170 along a substantially horizontal direction, and mirror 180-2 may scan the output beam 170 along a substantially vertical direction. A polygon mirror may have two or more reflective surfaces, and the polygon mirror may be continuously rotated in one direction so that the output beam 170 is reflected sequentially from each of the reflective surfaces. A polygon mirror may have a cross-sectional shape that corresponds to a polygon, where each side of the polygon has a reflective surface. For example, a polygon mirror with a square cross-sectional shape may have four reflective surfaces, and a polygon mirror with a pentagonal cross-sectional shape may have five reflective surfaces.

To direct the output beam 170 along a particular scan pattern, the scanner 162 may include two or more actuators driving a single mirror synchronously. For example, the two or more actuators can drive the mirror synchronously along two substantially orthogonal directions to make the output beam 170 follow a scan pattern with substantially straight lines. In some implementations, the scanner 162 may include two mirrors and actuators driving the two mirrors synchronously to generate a scan pattern that includes substantially straight lines. For example, a galvanometer actuator may drive the mirror 180-2 with a substantially linear back-and-forth motion (e.g., the galvanometer may be driven with a substantially sinusoidal or triangle-shaped waveform) that causes the output beam 170 to trace a substantially horizontal back-and-forth pattern, and another galvanometer actuator may scan the mirror 180-1 along a substantially vertical direction. The two galvanometers may be synchronized so that, for example, for every 64 horizontal traces, the output beam 170 makes a single trace along a vertical direction. Whether one or two mirrors are used, the substantially straight lines can be directed substantially horizontally, vertically, or along any other suitable direction.

The scanner 162 also may apply a dynamically adjusted deflection along a vertical direction (e.g., with a galvanometer actuator) as the output beam 170 is scanned along a substantially horizontal direction (e.g., with a galvanometer or resonant actuator) to achieve the straight lines. If a vertical deflection is not applied, the output beam 170 may trace out a curved path as it scans from side to side. In some implementations, the scanner 162 uses a vertical actuator to apply a dynamically adjusted vertical deflection as the output beam 170 is scanned horizontally as well as a discrete vertical offset between each horizontal scan (e.g., to step the output beam 170 to a subsequent row of a scan pattern).

With continued reference to FIG. 2, an overlap mirror 190 in this example implementation is configured to overlap the input beam 172 and output beam 170, so that the beams 170 and 172 are substantially coaxial. In FIG. 2, the overlap mirror 190 includes a hole, slot, or aperture 192 through which the output beam 170 passes, and a reflecting surface 194 that reflects at least a portion of the input beam 172 toward the receiver 164. The overlap mirror 190 may be oriented so that input beam 172 and output beam 170 are at least partially overlapped.

In some implementations, the overlap mirror 190 may not include a hole 192. For example, the output beam 170 may be directed to pass by a side of mirror 190 rather than passing through an aperture 192. The output beam 170 may pass alongside mirror 190 and may be oriented at a slight angle with respect to the orientation of the input beam 172. As another example, the overlap mirror 190 may include a small reflective section configured to reflect the output beam 170, and the rest of the overlap mirror 190 may have an AR coating configured to transmit the input beam 172.

The input beam 172 may pass through a lens 196 which focuses the beam onto an active region 166 of the receiver 164. The active region 166 may refer to an area over which receiver 164 may receive or detect input light. The active region may have any suitable size or diameter d, such as for example, a diameter of approximately 25 µm, 50 µm, 80 µm, 100 µm, 200 µm, 500 µm, 1 mm, 2 mm, or 5 mm. The overlap mirror 190 may have a reflecting surface 194 that is substantially flat or the reflecting surface 194 may be curved (e.g., the mirror 190 may be an off-axis parabolic mirror configured to focus the input beam 172 onto an active region of the receiver 140).

The aperture 192 may have any suitable size or diameter $\Phi_1$, and the input beam 172 may have any suitable size or diameter $\Phi_2$, where $\Phi_2$ is greater than $\Phi_1$. For example, the aperture 192 may have a diameter $\Phi_1$ of approximately 0.2 mm, 0.5 mm, 1 mm, 2 mm, 3 mm, 5 mm, or 10 mm, and the input beam 172 may have a diameter $\Phi_2$ of approximately 2 mm, 5 mm, 10 mm, 15 mm, 20 mm, 30 mm, 40 mm, or 50 mm. In some implementations, the reflective surface 194 of the overlap mirror 190 may reflect 70% or more of input beam 172 toward the receiver 164. For example, if the reflective surface 194 has a reflectivity R at an operating wavelength of the light source 160, then the fraction of input beam 172 directed toward the receiver 164 may be expressed as $R \times [1-(\Phi_1/\Phi_2)^2]$. As a more specific example, if R is 95%, $\Phi_1$ is 2 mm, and $\Phi_2$ is 10 mm, then approximately 91% of the input beam 172 may be directed toward the receiver 164 by the reflective surface 194.

FIG. 3 illustrates an example configuration in which several components of the lidar system 100 may operate to scan a 360-degree view of regard. Generally speaking, the field of view of a light source in this configuration follows a circular trajectory and accordingly defines a circular scan pattern on a two-dimensional plane. All points on the trajectory remain at the same elevation relative to the ground level, according to one implementation. In this case, separate beams may follow the circular trajectory with certain vertical offsets relative to each other. In another implementation, the points of the trajectory may define a spiral scan pattern in three-dimensional space. A single beam can be sufficient to trace out the spiral scan pattern but, if desired, multiple beams can be used.

In the example of FIG. 3, a rotating scan module 200 revolves around a central axis in one or both directions as indicated. An electric motor may drive the rotating scan module 200 around the central axis at a constant speed, for example. The rotating scan module 200 includes a scanner, a receiver, an overlap mirror, etc. The components of the rotating module 200 may be similar to the scanner 120, the receiver 140, and the overlap mirror 115. In some implementations, the subsystem 200 also includes a light source and a controller. In other implementations, the light source and/or the controller are disposed apart from the rotating scan module 200 and/or exchange optical and electrical signals with the components of the rotating scan module 200 via corresponding links.

The rotating scan module 200 may include a housing 210 with a window 212. Similar to the window 157 of FIG. 1, the window 212 may be made of glass, plastic, or any other suitable material. The window 212 allows outbound beams as well as return signals to pass through the housing 210. The arc length defined by the window 212 can correspond to any suitable percentage of the circumference of the housing 210. For example, the arc length can correspond to 5%, 20%, 30%, 60%, or possibly even 100% of the circumference.

Now referring to FIG. 4, a rotating scan module 220 is generally similar to the rotating scan module 200. In this implementation, however, the components of the rotating scan module 220 are disposed on a platform 222 which rotates inside a stationary circular housing 230. In this implementation, the circular housing 230 is substantially transparent to light at the lidar-system operating wavelength to pass inbound and outbound light signals. The circular housing 230 in a sense defines a circular window similar to the window 212, and may be made of similar material.

Generating Pixels within a Field of Regard

FIG. 5 illustrates an example scan pattern 240 which the lidar system 100 of FIG. 1 can produce. The lidar system 100 may be configured to scan output optical beam 125 along one or more scan patterns 240. In some implementations, the scan pattern 240 corresponds to a scan across any suitable field of regard (FOR) having any suitable horizontal FOR ($FOR_H$) and any suitable vertical FOR ($FOR_V$). For example, a certain scan pattern may have a field of regard represented by angular dimensions (e.g., $FOR_H \times FOR_V$) 40°×30°, 90°×40°, or 60°×15°. As another example, a certain scan pattern may have a $FOR_H$ greater than or equal to 10°, 25°, 30°, 40°, 60°, 90°, or 120°. As yet another example, a certain scan pattern may have a $FOR_V$ greater than or equal to 2°, 5°, 10°, 15°, 20°, 30°, or 45°. In the example of FIG. 5, a reference line 246 represents a center of the field of regard of scan pattern 240. The reference line 246 may have any suitable orientation, such as, a horizontal angle of 0° (e.g., reference line 246 may be oriented straight ahead) and a vertical angle of 0° (e.g., reference line 246 may have an inclination of 0°), or the reference line 246 may have a nonzero horizontal angle or a nonzero inclination (e.g., a vertical angle of +10° or −10°). In FIG. 5, if the scan pattern 240 has a 60°×15° field of regard, then the scan pattern 240 covers a ±30° horizontal range with respect to reference line 246 and a ±7.5° vertical range with respect to reference line 246. Additionally, the optical beam 125 in FIG. 5 has an orientation of approximately −15° horizontal and +3° vertical with respect to reference line 246. The beam 125 may be referred to as having an azimuth of −15° and an altitude of +3° relative to the reference line 246. An azimuth (which may be referred to as an azimuth angle) may represent a horizontal angle with respect to the reference line 246, and an altitude (which may be referred to as an altitude angle, elevation, or elevation angle) may represent a vertical angle with respect to the reference line 246.

The scan pattern 240 may include multiple pixels 242, and each pixel 242 may be associated with one or more laser pulses and one or more corresponding distance measurements. A cycle of scan pattern 240 may include a total of $P_x \times P_y$ pixels 242 (e.g., a two-dimensional distribution of $P_x$ by $P_y$ pixels). For example, the scan pattern 240 may include a distribution with dimensions of approximately 100-2,000 pixels 242 along a horizontal direction and approximately 4-400 pixels 242 along a vertical direction. As another example, the scan pattern 240 may include a distribution of 1,000 pixels 242 along the horizontal direction by 64 pixels 242 along the vertical direction (e.g., the frame size is 1000×64 pixels) for a total of 64,000 pixels per cycle of scan pattern 240. The number of pixels 242 along a horizontal direction may be referred to as a horizontal resolution of the scan pattern 240, and the number of pixels 242 along a vertical direction may be referred to as a vertical resolution of the scan pattern 240. As an example, the scan pattern 240 may have a horizontal resolution of greater than or equal to 100 pixels 242 and a vertical resolution of greater than or equal to 4 pixels 242. As another example, the scan pattern 240 may have a horizontal resolution of 100-2,000 pixels 242 and a vertical resolution of 4-400 pixels 242.

Each pixel 242 may be associated with a distance (e.g., a distance to a portion of a target 130 from which the corresponding laser pulse was scattered) or one or more angular values. As an example, the pixel 242 may be associated with a distance value and two angular values (e.g., an azimuth and altitude) that represent the angular location of the pixel 242 with respect to the lidar system 100. A distance to a portion of the target 130 may be determined based at least in part on a time-of-flight measurement for a corresponding pulse. An angular value (e.g., an azimuth or altitude) may correspond to an angle (e.g., relative to reference line 246) of the output beam 125 (e.g., when a corresponding pulse is emitted from lidar system 100) or an angle of the input beam 135 (e.g., when an input signal is received by lidar system 100). In some implementations, the lidar system 100 determines an angular value based at least in part on a position of a component of the scanner 120. For example, an azimuth or altitude value associated with the pixel 242 may be determined from an angular position of one or more corresponding scanning mirrors of the scanner 120.

The FOR illustrated in FIG. 5, which extends laterally in two dimensions (e.g., horizontal and vertical), may be referred to as a two-dimensional field of regard. In some embodiments, a FOR may include, may be part of, or may be referred to as a three-dimensional field of regard that also extends along a third dimension (e.g., axially). As an example, a three-dimensional FOR may be used in a range-gating application where a lidar system 100 is configured to operate over a particular distance range (e.g., from 50 m to 100 m from the lidar system). In some embodiments, a two-dimensional field of regard may be part of or may be configured as a three-dimensional field of regard. For example, a two-dimensional field of regard may be configured as a three-dimensional field of regard with the addition of a distance parameter that represents a distance range from the lidar system 100. As an example, a two-dimensional field of regard that covers the angular range 100°×20° may be configured as a three-dimensional field of regard with the addition of the distance parameter 50-100 meters.

In some implementations, the lidar system 100 concurrently directs multiple beams across the field of regard. In the example implementation of FIG. 6, the lidar system generates output beams 250A, 250B, 250C, . . . 250N etc., each of which follows a linear scan pattern 254A, 254B, 254C, . . . 254N. The number of parallel lines can be 2, 4, 12, 20, or any other suitable number. The lidar system 100 may angularly separate the beams 250A, 250B, 250C, . . . 250N, so that, for example, the separation between beams 250A and 250B at a certain distance may be 30 cm, and the separation between the same beams 250A and 250B at a longer distance may be 50 cm.

Similar to the scan pattern 240, each of the linear scan patterns 254A-N includes pixels associated with one or more laser pulses and distance measurements. FIG. 6 illustrates example pixels 252A, 252B and 252C along the scan patterns 254A, 254B and 254C, respectively. The lidar system 100 in this example may generate the values for the pixels 252A-252N at the same time, thus increasing the rate at which values for pixels are determined.

Depending on the implementation, the lidar system 100 may output the beams 250A-N at the same wavelength or different wavelengths. The beam 250A for example may have the wavelength of 1540 nm, the beam 250B may have the wavelength of 1550 nm, the beam 250C may have the wavelength of 1560 nm, etc. The number of different wavelengths the lidar system 100 uses need not match the number of beams. Thus, the lidar system 100 in the example implementation of FIG. 6 may use M wavelengths with N beams, where $1 \leq M \leq N$.

Next, FIG. 7 illustrates an example light-source field of view ($FOV_L$) and receiver field of view ($FOV_R$) for the lidar system 100. The light source 110 may emit pulses of light as the $FOV_L$ and $FOV_R$ are scanned by the scanner 120 across a field of regard (FOR). The light-source field of view may refer to an angular cone illuminated by the light source 110 at a particular instant of time. Similarly, a receiver field of view may refer to an angular cone over which the receiver 140 may receive or detect light at a particular instant of time, and any light outside the receiver field of view may not be received or detected. For example, as the scanner 120 scans the light-source field of view across a field of regard, the lidar system 100 may send the pulse of light in the direction the $FOV_L$ is pointing at the time the light source 110 emits the pulse. The pulse of light may scatter off the target 130, and the receiver 140 may receive and detect a portion of the scattered light that is directed along or contained within the $FOV_R$.

In some implementations, the scanner 120 is configured to scan both a light-source field of view and a receiver field of view across a field of regard of the lidar system 100. The lidar system 100 may emit and detect multiple pulses of light as the scanner 120 scans the $FOV_L$ and $FOV_R$ across the field of regard while tracing out the scan pattern 240. The scanner 120 in some implementations scans the light-source field of view and the receiver field of view synchronously with respect to one another. In this case, as the scanner 120 scans $FOV_L$ across a scan pattern 240, the $FOV_R$ follows substantially the same path at the same scanning speed. Additionally, the $FOV_L$ and $FOV_R$ may maintain the same relative position to one another as the scanner 120 scans $FOV_L$ and $FOV_R$ across the field of regard. For example, the $FOV_L$ may be substantially overlapped with or centered inside the $FOV_R$ (as illustrated in FIG. 7), and the scanner 120 may maintain this relative positioning between $FOV_L$ and $FOV_R$ throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction).

The $FOV_L$ may have an angular size or extent $\Theta_L$ that is substantially the same as or that corresponds to the divergence of the output beam 125, and the $FOV_R$ may have an angular size or extent $\Theta_R$ that corresponds to an angle over which the receiver 140 may receive and detect light. The receiver field of view may be any suitable size relative to the light-source field of view. For example, the receiver field of view may be smaller than, substantially the same size as, or larger than the angular extent of the light-source field of view. In some implementations, the light-source field of view has an angular extent of less than or equal to 50 milliradians, and the receiver field of view has an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent $\Theta_R$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. The light-source field of view and the receiver field of view may have approximately equal angular extents. As an example, $\Theta_L$ and $\Theta_R$ may both be approximately equal to 1 mrad, 2 mrad, or 3 mrad. In some implementations, the receiver field of view is larger than the light-source field of view, or the light-source field of view is larger than the receiver field of view. For example, $\Theta_L$ may be approximately equal to 1.5 mrad, and $\Theta_R$ may be approximately equal to 3 mrad.

A pixel 242 may represent or correspond to a light-source field of view. As the output beam 125 propagates from the light source 110, the diameter of the output beam 125 (as well as the size of the corresponding pixel 242) may increase according to the beam divergence $\Theta_L$. As an example, if the output beam 125 has a $\Theta_L$ of 2 mrad, then at a distance of 100 m from the lidar system 100, the output beam 125 may have a size or diameter of approximately 20 cm, and a corresponding pixel 242 may also have a corresponding size or diameter of approximately 20 cm. At a distance of 200 m from the lidar system 100, the output beam 125 and the corresponding pixel 242 may each have a diameter of approximately 40 cm.

A Lidar System Operating in a Vehicle

As indicated above, one or more lidar systems 100 may be integrated into a vehicle. In one example implementation, multiple lidar systems 100 may be integrated into a vehicle, such as a car, to provide a complete 360-degree horizontal FOR around the car. As another example, 4-10 lidar systems 100, each system having a 45-degree to 90-degree horizontal FOR, may be combined together to form a sensing system that provides a point cloud covering a 360-degree horizontal FOR. The lidar systems 100 may be oriented so that adjacent FORs have an amount of spatial or angular overlap to allow data from the multiple lidar systems 100 to be combined or stitched together to form a single or continuous 360-degree point cloud. As an example, the FOR of each lidar system 100 may have approximately 1-15 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, golf cart, motorhome, taxi, motorcycle, scooter, bicycle, skateboard, train, snowmobile, watercraft (e.g., a ship or boat), aircraft (e.g., a fixed-wing aircraft, helicopter, or dirigible), or spacecraft. In particular embodiments, a vehicle may include an internal combustion engine or an electric motor that provides propulsion for the vehicle.

In some implementations, one or more lidar systems 100 are included in a vehicle as part of an advanced driver assistance system (ADAS) to assist a driver of the vehicle in the driving process. For example, a lidar system 100 may be part of an ADAS that provides information or feedback to a driver (e.g., to alert the driver to potential problems or hazards) or that automatically takes control of part of a vehicle (e.g., a braking system or a steering system) to avoid collisions or accidents. The lidar system 100 may be part of a vehicle ADAS that provides adaptive cruise control, automated braking, automated parking, or collision avoidance, that alerts the driver to hazards or other vehicles, that maintains the vehicle in the correct lane, or that provides a warning if an object or another vehicle is near or in a blind spot.

In some cases, one or more lidar systems 100 are integrated into a vehicle as part of an autonomous-vehicle driving system. In an example implementation, the lidar system 100 provides information about the surrounding environment to a driving system of an autonomous vehicle. An autonomous-vehicle driving system may include one or more computing systems that receive information from the lidar system 100 about the surrounding environment, analyze the received information, and provide control signals to the vehicle's driving systems (e.g., steering wheel, accelerator, brake, or turn signal). For example, the lidar system 100 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 130 and their respective locations, distances, or speeds, and the autonomous-vehicle driving system may update control signals based on this information. As an example, if the lidar system 100 detects a vehicle ahead that is slowing down or stopping, the autonomous-vehicle driving system may send instructions to release the accelerator and apply the brakes.

An autonomous vehicle may be referred to as an autonomous car, driverless car, self-driving car, robotic car, or unmanned vehicle. An autonomous vehicle may be a vehicle configured to sense its environment and navigate or drive with little or no human input. For example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

An autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

In some implementations, a light source of a lidar system is located remotely from some of the other components of the lidar system such as the scanner and the receiver. Moreover, a lidar system implemented in a vehicle may include fewer light sources than scanners and receivers.

Figure 8:
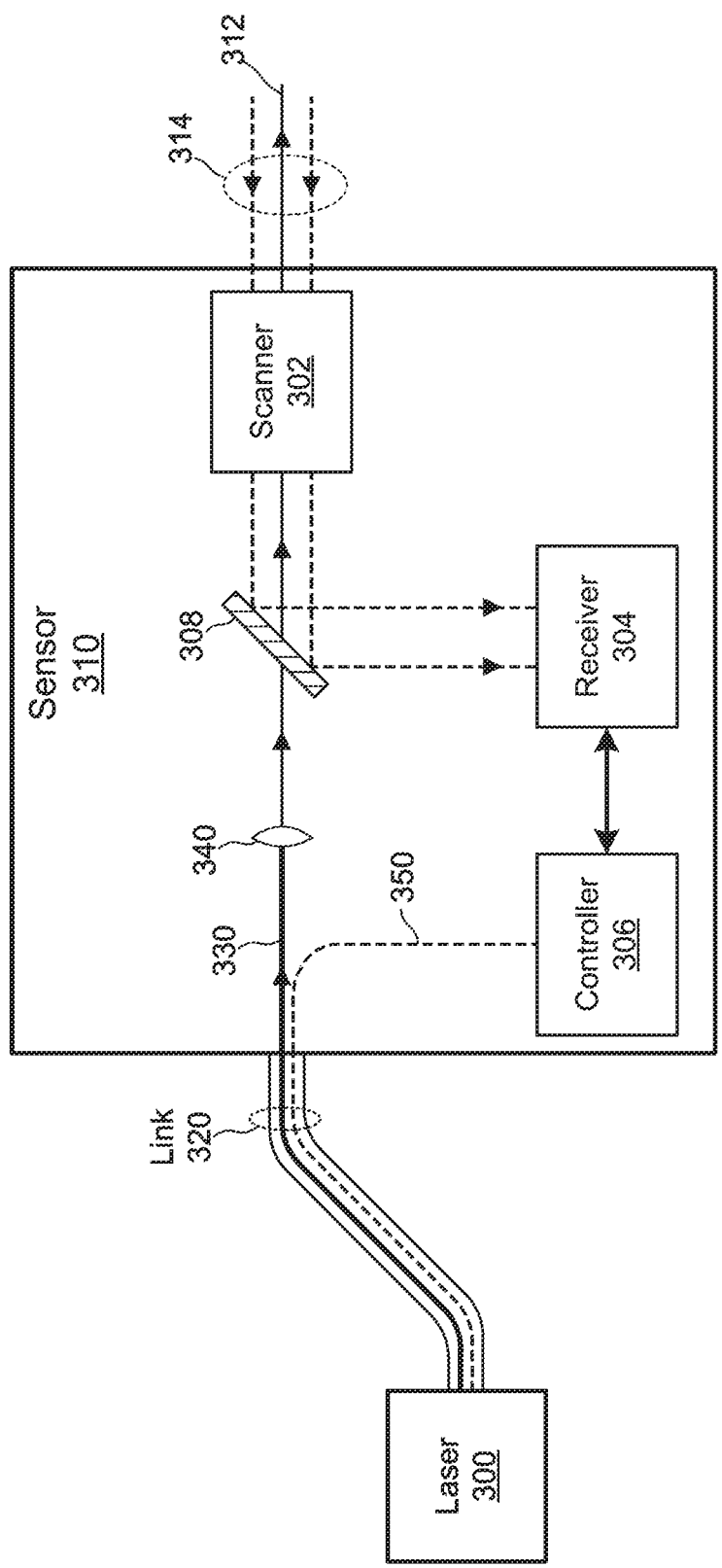
FIG. 8 illustrates an example configuration of the lidar system of FIG. 1 or another suitable lidar system, in which a laser is disposed away from sensor components.

FIG. 8 illustrates an example configuration in which a laser-sensor link 320 includes an optical link 330 and an electrical link 350 coupled between a laser 300 and a sensor 310. The laser 300 may be configured to emit pulses of light and may be referred to as a laser system, laser head, or light source. The laser 300 may include, may be part of, may be similar to, or may be substantially the same as the light source 110 illustrated in FIG. 1 and discussed above. Further, the scanner 302, the receiver 304, the controller 306, and the mirror 308 may be similar to the scanner 120, the receiver 140, the controller 150, and the mirror 115 discussed above. In the example of FIG. 8, the laser 300 is coupled to the remotely located sensor 310 by a laser-sensor link 320 (which may be referred to as a link). The sensor 310 may be referred to as a sensor head and may include the mirror 308, the scanner 302, the receiver 304, and the controller 306. In an example implementation, the laser 300 includes a pulsed laser diode (e.g., a pulsed DFB laser) followed by an optical amplifier, and light from the laser 300 is conveyed by an optical fiber of the laser-sensor link 320 of a suitable length to the scanner 120 in a remotely located sensor 310.

The laser-sensor link 320 may include any suitable number of optical links 330 (e.g., 0, 1, 2, 3, 5, or 10) and any suitable number of electrical links 350 (e.g., 0, 1, 2, 3, 5, or 10). In the example configuration depicted in FIG. 8, the laser-sensor link 320 includes one optical link 330 from the laser 300 to an output collimator 340 and one electrical link 350 that connects the laser 300 to the controller 150. The optical link 330 may include optical fiber (which may be referred to as fiber-optic cable or fiber) that conveys, carries, transports, or transmits light between the laser 300 and the sensor 310. The optical fiber may be, for example, single-mode (SM) fiber, multi-mode (MM) fiber, large-mode-area (LMA) fiber, polarization-maintaining (PM) fiber, photonic-crystal or photonic-bandgap fiber, gain fiber (e.g., rare-earth-doped optical fiber for use in an optical amplifier), or any suitable combination thereof. The output collimator 340 receives optical pulses conveyed from the laser 300 by the optical link 330 and produces a free-space optical beam 312 that includes the optical pulses. The output collimator 340 directs the free-space optical beam 312 through the mirror 308 and to the scanner 302.

The electrical link 350 may include electrical wire or cable (e.g., a coaxial cable or twisted-pair cable) that conveys or transmits electrical power and/or one or more electrical signals between the laser 300 and the sensor 310. For example, the laser 300 may include a power supply or a power conditioner that provides electrical power to the laser 300, and additionally, the power supply or power conditioner may provide power to one or more components of the sensor 310 (e.g., the scanner 304, the receiver 304, and/or the controller 306) via the one or more electrical links 350. The electrical link 350 in some implementations may convey electrical signals that include data or information in analog or digital format. Further, the electrical link 350 may provide an interlock signal from the sensor 310 to the laser 300. If the controller 306 detects a fault condition indicating a problem with the sensor 310 or the overall lidar system, the controller 306 may change a voltage on the interlock line (e.g., from 5 V to 0 V) indicating that the laser 300 should shut down, stop emitting light, or reduce the power or energy of emitted light. A fault condition may be triggered by a failure of the scanner 302, a failure of the receiver 304, or by a person or object coming within a threshold distance of the sensor 310 (e.g., within 0.1 m, 0.5 m, 1 m, 5 m, or any other suitable distance).

As discussed above, a lidar system can include one or more processors to determine a distance D to a target. In the implementation illustrated in FIG. 8, the controller 306 may be located in the laser 300 or in the sensor 310, or parts of the controller 150 may be distributed between the laser 300 and the sensor 310. In an example implementation, each sensor head 310 of a lidar system includes electronics (e.g., an electronic filter, transimpedance amplifier, threshold detector, or time-to-digital (TDC) converter) configured to receive or process a signal from the receiver 304 or from an APD or SPAD of the receiver 304. Additionally, the laser 300 may include processing electronics configured to determine a time-of-flight value or a distance to the target based on a signal received from the sensor head 310 via the electrical link 350.

Figure 9:
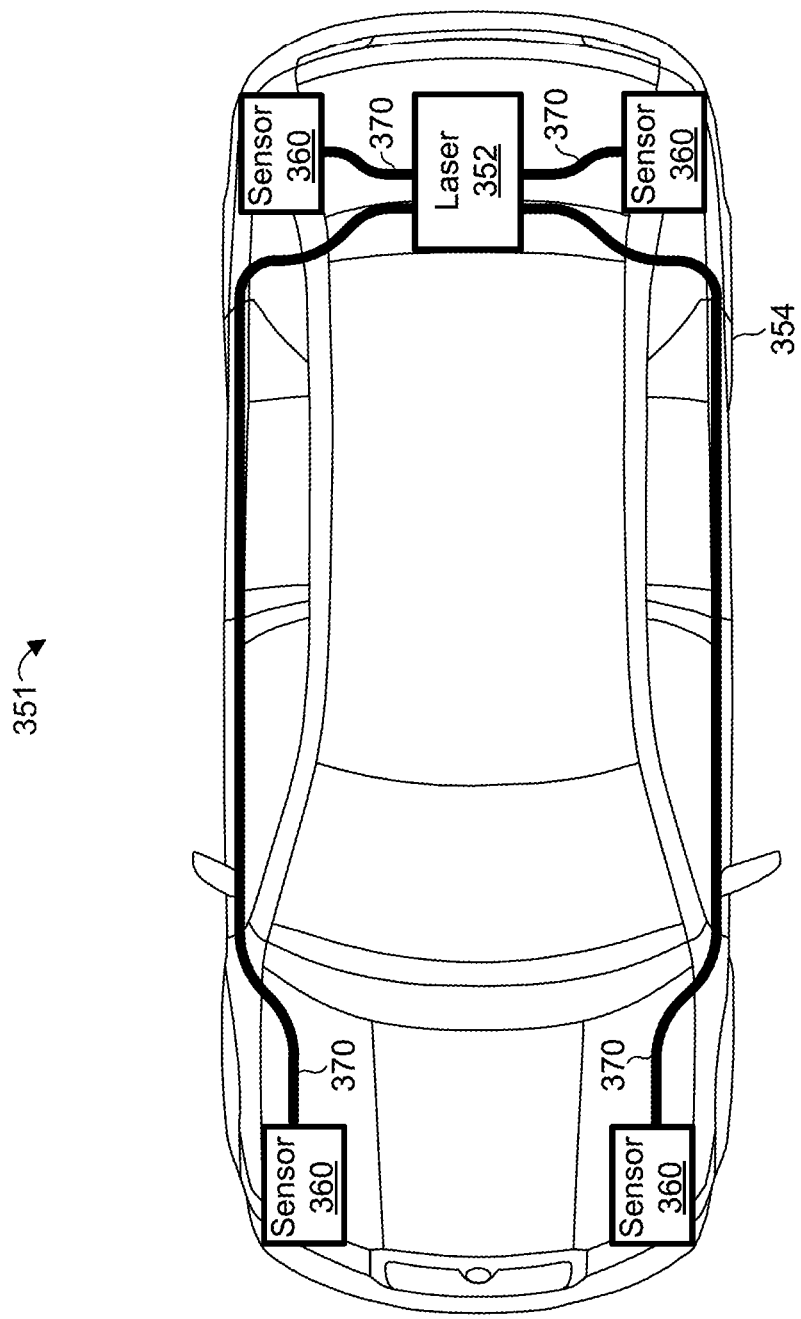
FIG. 9 illustrates an example vehicle in which the lidar system of FIG. 1 can operate; a FIG. 10 illustrates an example InGaAs avalanche photodiode which can operate in the lidar system of FIG. 1.

Next, FIG. 9 illustrates an example vehicle 354 with a lidar system 351 that includes a laser 352 with multiple sensor heads 360 coupled to the laser 352 via multiple laser-sensor links 370. The laser 352 and the sensor heads 360 may be similar to the laser 300 and the sensor 310 discussed above, in some implementations. For example, each of the laser-sensor links 370 may include one or more optical links and/or one or more electrical links. The sensor heads 360 in FIG. 9 are positioned or oriented to provide a greater than 30-degree view of an environment around the vehicle. More generally, a lidar system with multiple sensor heads may provide a horizontal field of regard around a vehicle of approximately 30°, 45°, 60°, 90°, 120°, 180°, 270°, or 360°. Each of the sensor heads may be attached to or may be incorporated into a bumper, fender, grill, side panel, spoiler, roof, headlight assembly, taillight assembly, rear-view mirror assembly, hood, trunk, window, or any other suitable part of the vehicle.

In the example of FIG. 9, four sensor heads 360 are positioned at or near the four corners of the vehicle (e.g., the sensor heads may be incorporated into a light assembly, side panel, bumper, or fender), and the laser 352 may be located within the vehicle (e.g., in or near the trunk). The four sensor heads 360 may each provide a 90° to 120° horizontal field of regard (FOR), and the four sensor heads 360 may be oriented so that together they provide a complete 360-degree view around the vehicle. As another example, the lidar system 351 may include six sensor heads 360 positioned on or around a vehicle, where each of the sensor heads 360 provides a 60° to 90° horizontal FOR. As another example, the lidar system 351 may include eight sensor heads 360, and each of the sensor heads 360 may provide a 45° to 60° horizontal FOR. As yet another example, the lidar system 351 may include six sensor heads 360, where each of the sensor heads 360 provides a 70° horizontal FOR with an overlap between adjacent FORs of approximately 10°. As another example, the lidar system 351 may include two sensor heads 360 which together provide a forward-facing horizontal FOR of greater than or equal to 30°.

Data from each of the multiple sensor heads 360 may be combined or stitched together to generate a point cloud that covers a greater than or equal to 30-degree horizontal view around a vehicle. For example, the laser 352 may include a controller or processor that receives data from each of the sensor heads 360 (e.g., via a corresponding electrical link 350) and processes the received data to construct a point cloud covering a 360-degree horizontal view around a vehicle or to determine distances to one or more targets.

Example Receiver Implementation

Figure 10:
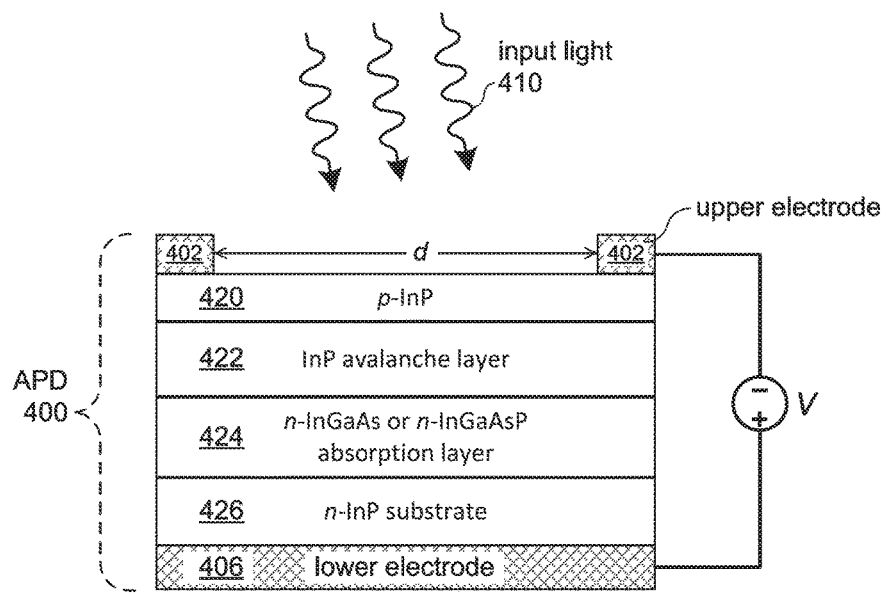

FIG. 10 illustrates an example InGaAs avalanche photodiode (APD) 400. Referring back to FIG. 1, the receiver 140 may include one or more APDs 400 configured to receive and detect light from input light such as the beam 135. More generally, the APD 400 can operate in any suitable receiver of input light. The APD 400 may be configured to detect a portion of pulses of light which are scattered by a target located downrange from the lidar system in which the APD 400 operates. For example, the APD 400 may receive a portion of a pulse of light scattered by the target 130 depicted in FIG. 1, and generate an electrical-current signal corresponding to the received pulse of light.

The APD 400 may include doped or undoped layers of any suitable semiconductor material, such as for example, silicon, germanium, InGaAs, InGaAsP, or indium phosphide (InP). Additionally, the APD 400 may include an upper electrode 402 and a lower electrode 406 for coupling the ADP 400 to an electrical circuit. The APD 400 for example may be electrically coupled to a voltage source that supplies a reverse-bias voltage V to the APD 400. Additionally, the APD 400 may be electrically coupled to a transimpedance amplifier which receives electrical current generated by the APD 400 and produces an output voltage signal that corresponds to the received current. The upper electrode 402 or lower electrode 406 may include any suitable electrically conductive material, such as for example a metal (e.g., gold, copper, silver, or aluminum), a transparent conductive oxide (e.g., indium tin oxide), a carbon-nanotube material, or polysilicon. In some implementations, the upper electrode 402 is partially transparent or has an opening to allow input light 410 to pass through to the active region of the APD 400. In FIG. 10, the upper electrode 402 may have a ring shape that at least partially surrounds the active region of the APD 400, where the active region refers to an area over which the APD 400 may receive and detect the input light 410. The active region may have any suitable size or diameter d, such as for example, a diameter of approximately 25 µm, 50 µm, 80 µm, 100 µm, 200 µm, 500 µm, 1 mm, 2 mm, or 5 mm.

The APD 400 may include any suitable combination of any suitable semiconductor layers having any suitable doping (e.g., n-doped, p-doped, or intrinsic undoped material). In the example of FIG. 10, the InGaAs APD 400 includes a p-doped InP layer 420, an InP avalanche layer 422, an absorption layer 424 with n-doped InGaAs or InGaAsP, and an n-doped InP substrate layer 426. Depending on the implementation, the APD 400 may include separate absorption and avalanche layers, or a single layer may act as both an absorption and avalanche region. The APD 400 may operate electrically as a PN diode or a PIN diode, and, during operation, the APD 400 may be reverse-biased with a positive voltage V applied to the lower electrode 406 with respect to the upper electrode 402. The applied reverse-bias voltage V may have any suitable value, such as for example approximately 5 V, 10 V, 20 V, 30 V, 50 V, 75 V, 100 V, or 200 V.

In FIG. 10, photons of the input light 410 may be absorbed primarily in the absorption layer 424, resulting in the generation of electron-hole pairs (which may be referred to as photo-generated carriers). For example, the absorption layer 424 may be configured to absorb photons corresponding to the operating wavelength of the lidar system 100 (e.g., any suitable wavelength between approximately 1400 nm and approximately 1600 nm). In the avalanche layer 422, an avalanche-multiplication process occurs where carriers (e.g., electrons or holes) generated in the absorption layer 424 collide with the semiconductor lattice of the absorption layer 424, and produce additional carriers through impact ionization. This avalanche process can repeat numerous times so that one photo-generated carrier may result in the generation of multiple carriers. As an example, a single photon absorbed in the absorption layer 424 may lead to the generation of approximately 10, 50, 100, 200, 500, 1000, 10,000, or any other suitable number of carriers through an avalanche-multiplication process. The carriers generated in an APD 400 may produce an electrical current that is coupled to an electrical circuit which may perform, for example, signal amplification, sampling, filtering, signal conditioning, analog-to-digital conversion, time-to-digital conversion, pulse detection, threshold detection, rising-edge detection, or falling-edge detection.

The number of carriers generated from a single photo-generated carrier may increase as the applied reverse bias V is increased. If the applied reverse bias V is increased above a particular value referred to as the APD breakdown voltage, then a single carrier can trigger a self-sustaining avalanche process (e.g., the output of the APD 400 is saturated regardless of the input light level). The APD 400 that is operated at or above a breakdown voltage may be referred to as a single-photon avalanche diode (SPAD) and may be referred to as operating in a Geiger mode or a photon-counting mode. The APD 400 that is operated below a breakdown voltage may be referred to as a linear APD, and the output current generated by the APD 400 may be sent to an amplifier circuit (e.g., a transimpedance amplifier). The receiver 140 (see FIG. 1) may include an APD configured to operate as a SPAD and a quenching circuit configured to reduce a reverse-bias voltage applied to the SPAD when an avalanche event occurs in the SPAD. The APD 400 configured to operate as a SPAD may be coupled to an electronic quenching circuit that reduces the applied voltage V below the breakdown voltage when an avalanche-detection event occurs. Reducing the applied voltage may halt the avalanche process, and the applied reverse-bias voltage may then be re-set to await a subsequent avalanche event. Additionally, the APD 400 may be coupled to a circuit that generates an electrical output pulse or edge when an avalanche event occurs.

In some implementations, the APD 400 or the APD 400 along with transimpedance amplifier have a noise-equivalent power (NEP) that is less than or equal to 100 photons, 50 photons, 30 photons, 20 photons, or 10 photons. For example, the APD 400 may be operated as a SPAD and may have a NEP of less than or equal to 20 photons. As another example, the APD 400 may be coupled to a transimpedance amplifier that produces an output voltage signal with a NEP of less than or equal to 50 photons. The NEP of the APD 400 is a metric that quantifies the sensitivity of the APD 400 in terms of a minimum signal (or a minimum number of photons) that the APD 400 can detect. The NEP may correspond to an optical power (or to a number of photons) that results in a signal-to-noise ratio of 1, or the NEP may represent a threshold number of photons above which an optical signal may be detected. For example, if the APD 400 has a NEP of 20 photons, then the input beam 410 with 20 photons may be detected with a signal-to-noise ratio of approximately 1 (e.g., the APD 400 may receive 20 photons from the input beam 410 and generate an electrical signal representing the input beam 410 that has a signal-to-noise ratio of approximately 1). Similarly, the input beam 410 with 100 photons may be detected with a signal-to-noise ratio of approximately 5. In some implementations, the lidar system 100 with the APD 400 (or a combination of the APD 400 and transimpedance amplifier) having a NEP of less than or equal to 100 photons, 50 photons, 30 photons, 20 photons, or 10 photons offers improved detection sensitivity with respect to a conventional lidar system that uses a PN or PIN photodiode. For example, an InGaAs PIN photodiode used in a conventional lidar system may have a NEP of approximately $10^4$ to $10^5$ photons, and the noise level in a lidar system with an InGaAs PIN photodiode may be $10^3$ to $10^4$ times greater than the noise level in a lidar system 100 with the InGaAs APD detector 400.

Referring back to FIG. 1, an optical filter may be located in front of the receiver 140 and configured to transmit light at one or more operating wavelengths of the light source 110 and attenuate light at surrounding wavelengths. For example, an optical filter may be a free-space spectral filter located in front of APD 400 of FIG. 10. This spectral filter may transmit light at the operating wavelength of the light source 110 (e.g., between approximately 1530 nm and 1560 nm) and attenuate light outside that wavelength range. As a more specific example, light with wavelengths of approximately 400-1530 nm or 1560-2000 nm may be attenuated by any suitable amount, such as for example, by at least 5 dB, 10 dB, 20 dB, 30 dB, or 40 dB.

Figure 11:
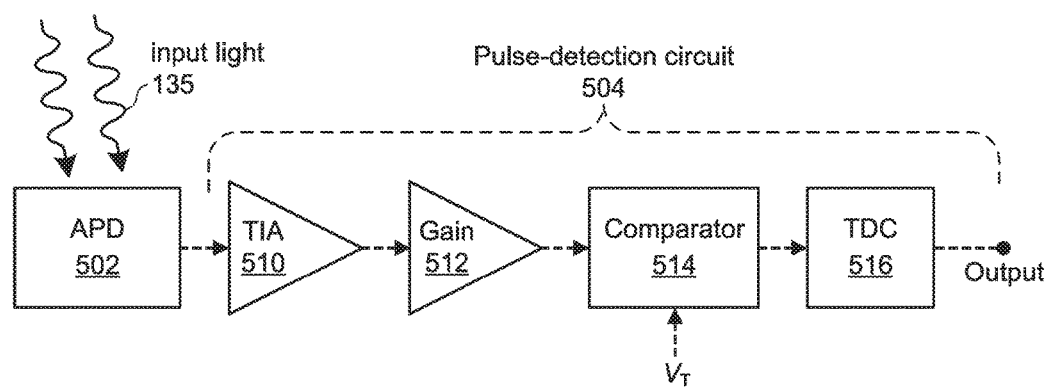
FIG. 11 illustrates an example photodiode coupled to a pulse-detection circuit, which can operate in the lidar system of FIG. 1.

Next, FIG. 11 illustrates an APD 502 coupled to an example pulse-detection circuit 504. The APD 502 can be similar to the APD 400 discussed above with reference to FIG. 10, or can be any other suitable detector. The pulse-detection circuit 504 can operate in the lidar system of FIG. 1 as part of the receiver 140. Further, the pulse-detection circuit 504 can operate in the receiver 164 of FIG. 2, the receiver 304 of FIG. 8, or any other suitable receiver. The pulse-detection circuit 504 alternatively can be implemented in the controller 150, the controller 306, or another suitable controller. In some implementations, parts of the pulse-detection circuit 504 can operate in a receiver and other parts of the pulse-detection circuit 504 can operate in a controller. For example, components 510 and 512 may be a part of the receiver 140, and components 514 and 516 may be a part of the controller 150.

The pulse-detection circuit 504 may include circuitry that receives a signal from a detector (e.g., an electrical current from the APD 502) and performs current-to-voltage conversion, signal amplification, sampling, filtering, signal conditioning, analog-to-digital conversion, time-to-digital conversion, pulse detection, threshold detection, rising-edge detection, or falling-edge detection, as examples. The pulse-detection circuit 504 may determine whether an optical pulse has been received by the APD 502 or may determine a time associated with receipt of an optical pulse by the APD 502. Additionally, the pulse-detection circuit 504 may determine a duration of a received optical pulse. In an example implementation, the pulse-detection circuit 504 includes a transimpedance amplifier (TIA) 510, a gain circuit 512, a comparator 514, and a time-to-digital converter (TDC) 516.

The TIA 510 may be configured to receive an electrical-current signal from the APD 502 and produce a voltage signal that corresponds to the received electrical-current signal. For example, in response to a received optical pulse, the APD 502 may produce a current pulse corresponding to the optical pulse. The TIA 510 may receive the current pulse from the APD 502 and produce a voltage pulse that corresponds to the received current pulse. The TIA 510 may also act as an electronic filter. For example, the TIA 510 may be configured as a low-pass filter that removes or attenuates high-frequency electrical noise by attenuating signals above a particular frequency (e.g., above 1 MHz, 10 MHz, 20 MHz, 50 MHz, 100 MHz, 200 MHz, or any other suitable frequency).

The gain circuit 512 may be configured to amplify a voltage signal. As an example, the gain circuit 512 may include one or more voltage-amplification stages that amplify a voltage signal received from the TIA 510. For example, the gain circuit 512 may receive a voltage pulse from the TIA 510, and the gain circuit 512 may amplify the voltage pulse by any suitable amount, such as for example, by a gain of approximately 3 dB, 10 dB, 20 dB, 30 dB, 40 dB, or 50 dB. Additionally, the gain circuit 512 may also act as an electronic filter configured to remove or attenuate electrical noise.

The comparator 514 may be configured to receive a voltage signal from the TIA 510 or the gain circuit 512 and produce an electrical-edge signal (e.g., a rising edge or a falling edge) when the received voltage signal rises above or falls below a particular threshold voltage $V_T$. As an example, when a received voltage rises above $V_T$, the comparator 514 may produce a rising-edge digital-voltage signal (e.g., a signal that steps from approximately 0 V to approximately 2.5 V, 3.3 V, 5 V, or any other suitable digital-high level). As another example, when a received voltage falls below $V_T$, the comparator 514 may produce a falling-edge digital-voltage signal (e.g., a signal that steps down from approximately 2.5 V, 3.3 V, 5 V, or any other suitable digital-high level to approximately 0 V). The voltage signal received by the comparator 514 may be received from the TIA 510 or the gain circuit 512 and may correspond to an electrical-current signal generated by the APD 502. For example, the voltage signal received by the comparator 514 may include a voltage pulse that corresponds to an electrical-current pulse produced by the APD 502 in response to receiving an optical pulse. The voltage signal received by the comparator 514 may be an analog signal, and an electrical-edge signal produced by the comparator 514 may be a digital signal.

The time-to-digital converter (TDC) 516 may be configured to receive an electrical-edge signal from the comparator 514 and determine an interval of time between emission of a pulse of light by the light source and receipt of the electrical-edge signal. The output of the TDC 516 may be a numerical value that corresponds to the time interval determined by the TDC 516. In some implementations, the TDC 516 has an internal counter or clock with any suitable period, such as for example, 5 ps, 10 ps, 15 ps, 20 ps, 30 ps, 50 ps, 100 ps, 0.5 ns, 1 ns, 2 ns, 5 ns, or 10 ns. The TDC 516 for example may have an internal counter or clock with a 20 ps period, and the TDC 516 may determine that an interval of time between emission and receipt of a pulse is equal to 25,000 time periods, which corresponds to a time interval of approximately 0.5 microseconds. Referring back to FIG. 1, the TDC 516 may send the numerical value "25000" to a processor or controller 150 of the lidar system 100, which may include a processor configured to determine a distance from the lidar system 100 to the target 130 based at least in part on an interval of time determined by a TDC 516. The processor may receive a numerical value (e.g., "25000") from the TDC 516 and, based on the received value, the processor may determine the distance from the lidar system 100 to a target 130.

In one case, a lidar system includes a transmitter with a light source that generates a laser light at an intrinsically eye-safe wavelength, e.g., 1550 nm, and a receiver with a linear-mode avalanche photodiode (APD) detector. Relative to the 905 nm wavelength, where other automotive LIDAR systems typically operate, there is an increase in the number of photons per mW of energy at the 1550 nm wavelength. Moreover, the 1550 nm wavelength is better suited for complying with eye safety requirements. Generally speaking, the system uses a linear-mode avalanche detector (the APD) to better take advantage of the increased number of photons returned from the reflected target at the 1550 nm wavelength. Contrary to typical single-photon detectors currently used in automotive lidar systems (which produce a fixed output upon the detection of a "single" photon), the linear-mode avalanche detector produces an output that is dependent on (e.g., is proportional to) the number of photons incident on the detector in a particular time period. The use of this type of detector enables the detection of rising and falling edge, intensity, and amplitude characteristics of the returned pulse, which provides for longer range detection and a more robust and accurate detection system.

As noted above, the use of a linear-mode APD (for example at approximately the 1550 nm wavelength) provides the opportunity to perform enhanced detection activities on the received reflected light pulse from a target, and some of these enhanced detection activities, and the systems configured to perform these enhanced detection activities will be described in more detail below. It will be noted that, while these systems are described as using a transmitter that transmits light pulses at approximately the 1550 nm wavelength, the transmitter could transmit at other wavelengths instead (or as well in a multiple wavelength system). For example, the transmitter could transmit pulses at a wavelength below approximately 1900 nanometers, at a wavelength between approximately 1500 nanometers and 1600 nanometers, at a wavelength above approximately 1100 nanometers, above 1400 nanometers, in a range between 1400 and 1900 nanometers, in a range between 1530 and 1580 nanometers, etc. In these cases, the system may use a linear-mode APD formed as a Indium-Gallium-Arsenide (InGaAs) semi-conductor material. Still further, in some instances, the systems described below could use a transmitter that transmits light pulses having wavelengths below 1100 nanometers, such as between 900 and 1000 nanometers, at approximately 950 nanometers, etc. In these cases, the systems may use an APD formed as a silicon semi-conductor material.

Example Range Walk Compensation Techniques

Figure 12:
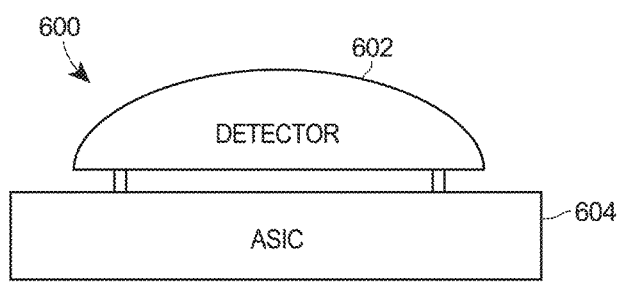
FIG. 12 illustrates a receiver having a lidar detector disposed directly on an application specific integrated circuit (ASIC) that processes light detection signals generated by the receiver.

Generally, FIG. 12 illustrates a block diagram of a receiver 600 configured as a light detector 602, which may be, for example, an APD or other detector 400 illustrated in FIG. 10, disposed directly on an application-specific integrated circuit (ASIC) 604. In this case, the ASIC 604 is an integrated circuit having circuitry thereon that processes the electrical signals produced by the light detector 602 in response to detecting light signals. The light detector 602 may be mounted directly on the ASIC 604 and may have any output that is electrically connected to an input of the ASIC 604. More particularly, FIG. 12 illustrates a light detector 602 that is directly bump-bonded to the ASIC 604 which may include or be configured to include a readout integrated circuit (ROIC). Generally speaking, an ASIC is any integrated circuit (IC) customized for a particular use while a ROIC is a specific type of ASIC designed for reading/processing signals from detectors. For example, the light detector 602 may be configured as a CCD array coupled to a ROIC that receives and accumulates charge from each pixel of the CCD. The ROIC may then provide an output signal to a circuit (e.g., other parts of the ASIC 604) for readout (to determine the amount of accumulated charge). The ROIC described here, however, may be different than a traditional ROIC, as the ROIC in the system of FIG. 12 may do much more than accumulate charge and provide a readout value. Here, the ROIC performs current-to-voltage conversion (with the TIA), voltage amplification, filtering, edge/level detection, timing, and TDC (time-to-digital conversion). As a result, the terms ASIC and ROIC may be used interchangeably in this description.

Figure 13:
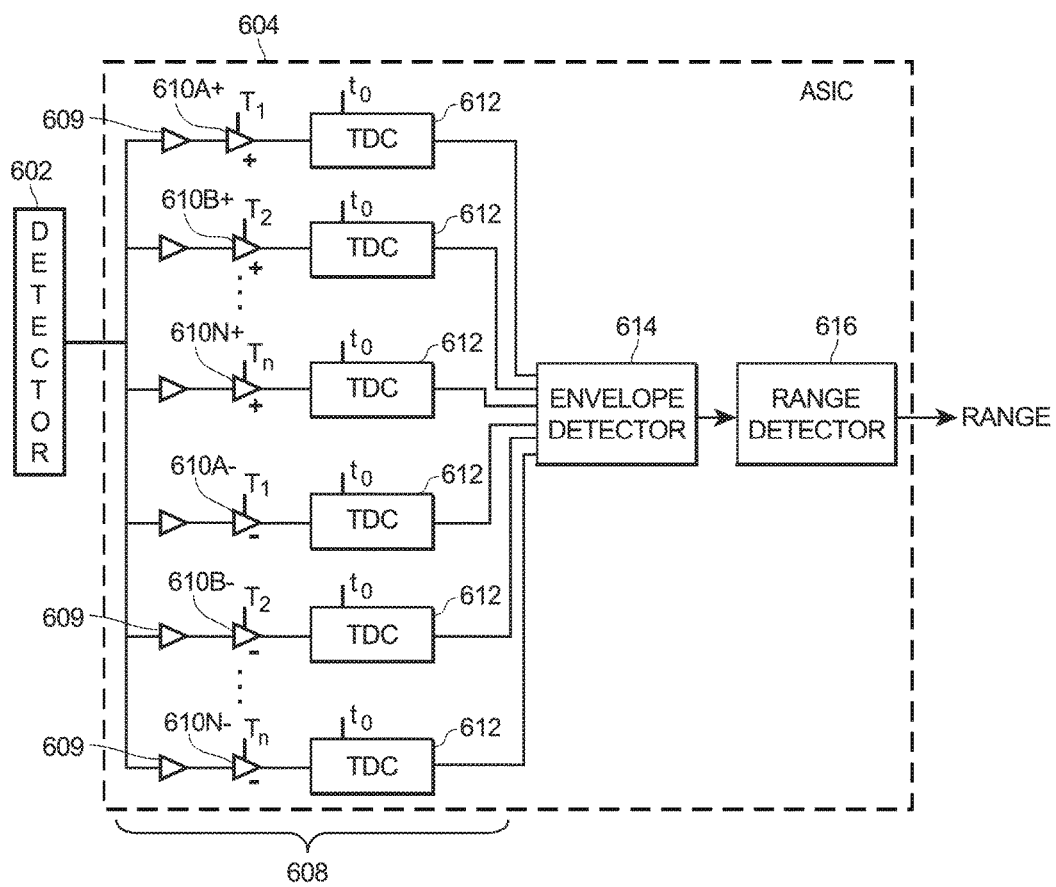
FIG. 13 illustrates an example lidar detector system that includes a plurality of time to digital convertors (TDCs) to enable enhanced pulse envelope and range detection.

Still further, the detector 602 is electrically (and mechanically) connected to the ASIC 604 by "bump bonding" where a small ball of solder is attached to a surface to form a solder "bump." For example, the bumps may be attached to solder pads of the ASIC 604, and the corresponding connectors of the detector package may then be brought into contact with the bumps. The two devices are then "bump bonded" (or, soldered) together by heating, to allow the solder bumps to reflow. Bump bonding has advantages over other types of electrical connectors, including smaller overall size (e.g., compared to connecting the ASIC and detector with wire or wire bonding), better reliability, higher electrical speed (the shorter distance provided by the bump bond has lower parasitic capacitance or inductance), and less electrical noise (the signal travels a relatively short distance from the detector to the ASIC, which means there is less chance for the signal to become degraded or corrupted by picking up noise). FIG. 13 illustrates the receiver 600 of FIG. 12 in more detail and, in particular, depicts an example set of circuitry that may be disposed on the ASIC 604 of the receiver 600 of FIG. 12. In particular, FIG. 13 illustrates the detector 602, which may be any suitable light detector as described herein, coupled directly to the ASIC 604. The circuitry of the ASIC 604 is illustrated in block diagram form in FIG. 13, but it will be understood that this circuitry may be disposed in any suitable manner on an integrated circuit, such as one that is silicon based. In any event, the output of the detector 602 includes one or more electrical signals produced as a result of the detection of light or photons arriving in the detector 602, and which are referred to herein as light detection signals. These light detection signals are provided to a set of parallel connected amplitude detection circuits 608 on the ASIC 604. Each of the parallel connected amplitude detection circuits 608 is illustrated as including an amplifier 609, a comparator 610 and a time-to-digital converter (TDC) 612. The output of each of the amplitude detection circuits 608 is provided to an envelope detection circuit 614, which has one or more outputs connected to a range detection circuit 616. An amplitude detection circuit 608, which may include a comparator 610 and a TDC 612, may be referred to as an amplitude detector, a magnitude detection circuit, or a magnitude detector.

More particularly, the amplifiers 609 amplify the light detection signals from the light detector 602 and provide an amplified signal to a comparator 610. While the circuitry of FIG. 13 is illustrated as including a separate amplifier 609 disposed in each of the parallel connected amplitude detection circuits 608, one or more amplifiers (e.g., a TIA 510 and/or a gain circuit 512) could be configured to amplify the light detection signals from the detector 602 prior to the light detection signals being split and provided to the separate amplitude detection circuits 608. In any event, the output of each of the amplifiers 609 is provided to an associated comparator 610 which compares the amplified light detection signal to a particular threshold value and outputs a positive or other signal indicating when the comparison criteria is met. In this case, a separate comparator (labeled 610A, 610B, . . . 610N) is illustrated as being disposed in each of the amplitude detection circuits 608. More particularly, each of the comparators 610 receives an input threshold signal T, indicated more specifically by a reference number $T_1, T_2, \ldots T_n$, and compares the amplified light signal to the associated threshold value. Preferably, each of the threshold signals $T_1$-$T_n$ is a different value ranging from a minimum to a maximum value, and these thresholds T will be various values within the expected range of the detected amplitudes of the light detection signals produced by the detector 602. Some or all of the threshold values T may range linearly (e.g., may be equally spaced apart), or may range non-linearly (e.g., be non-equally spaced apart). There may be, for example, more threshold values at the top of the amplitude detection range, at the bottom or lower part of the amplitude detection range, in the middle of the amplitude detection range, etc. Still further, any number of amplitude detection circuits 608 (and associated comparators 610 and TDCs 612) may be provided in the ASIC 604. Generally speaking, the more amplitude detection circuits that are provided, the greater or better envelope detection that can be performed by the envelope detector 614.

Still further, as illustrated in FIG. 13, there may be two amplitude detection circuits 608 associated with each particular threshold value ($T_1$, for example). In particular, there are two types of comparators 610, including rising-edge comparators, indicated with a plus sign (+), and falling-edge comparators, indicated with a minus sign (−). As will be understood, rising-edge comparators determine when the amplified light detection signal provided at the input thereto reaches or rises above the threshold T going in a positive or rising direction (that is, reaches the threshold from a lower value). On the other hand, falling-edge comparators determine or detect when the amplified light detection signals at the input thereto reach or fall below the associated threshold T in the negative or falling direction (that is, reach the threshold from a higher value). Thus, the comparator 610A+ provides a comparison between the incoming light detection signal to the threshold $T_1$, and determines when the incoming light detection signal reaches the level of threshold $T_1$ going in a positive direction, while the comparator 610A− determines when the light signal reaches the threshold $T_1$ going in the negative or falling direction. Upon making a determination that the light detection signal meets the associated threshold from the correct direction, the comparator produces an output signal that indicates such a condition (i.e., that the comparison criteria is met). As illustrated in FIG. 13, the output signal of each comparator 610, which may be a direct current (DC) signal, a rising-edge or falling-edge signal, or a digital bit indicative of the status of the comparison (e.g., met or not met), is provided to an associated TDC 612.

As explained above, each TDC (including the TDCs 612) includes a very precise and high-speed counter or timer, and the TDCs 612 clock, store, and/or output the value or values of the associated timer when the TDC 612 receives an appropriate (e.g., positive) input from the associated comparator 610. Moreover, each of the TDCs 612 receives a timing initialization signal $t_o$, which may generally indicate the time at which the lidar system transmitter generated and/or transmitted a light pulse associated with the current field of regard of the current scan. This initial timing signal $t_0$ may be provided as an electrical signal from a controller that controls the transmitter, by a sensor which senses when the light pulse is actually transmitted from the transmitter, etc. Moreover, the timing initialization signal $t_0$ may be generated by the transmitter based on or to coincide with the rising edge of the transmitted light pulse, the falling edge of the transmitted light pulse, the peak or center of the transmitted light pulse or any other desired point or location on the transmitted light pulse. Thus, as will be understood, the TDCs 612 reset and start the counters when they receive the $t_0$ initialization signal, and clock or store the counter value as a digital output signal when receiving a signal from an associated comparator 610 that the detected incoming light pulse has reach a certain threshold T in a rising or falling direction. The TDCs 612 may output a digital signal indicating the one or more times that the incoming light detection signal met the threshold in the appropriate direction and these output signals are provided to the envelope detector 614.

Of course, all of the TDCs 612 operate in parallel with one another simultaneously so that the various amplitude detection circuits 608 determine the various different times (relative to the time $t_0$) at which a detected light pulse reaches various amplitudes associated with the thresholds $T_1$-$T_n$ in the rising and falling directions.

In some embodiments, an ASIC 604 may include an analog-to-digital converter (ADC). As an example, rather than using a parallel arrangement of multiple TDCs, the ASIC 604 may include an ADC configured to produce a digital representation of a received pulse. The ADC may be located after the transimpedance amplifier 510 or the gain circuit 512 in FIG. 11 and may produce a series of points corresponding to the envelope of a received pulse (similar to that illustrated in FIG. 14).

Figure 14:
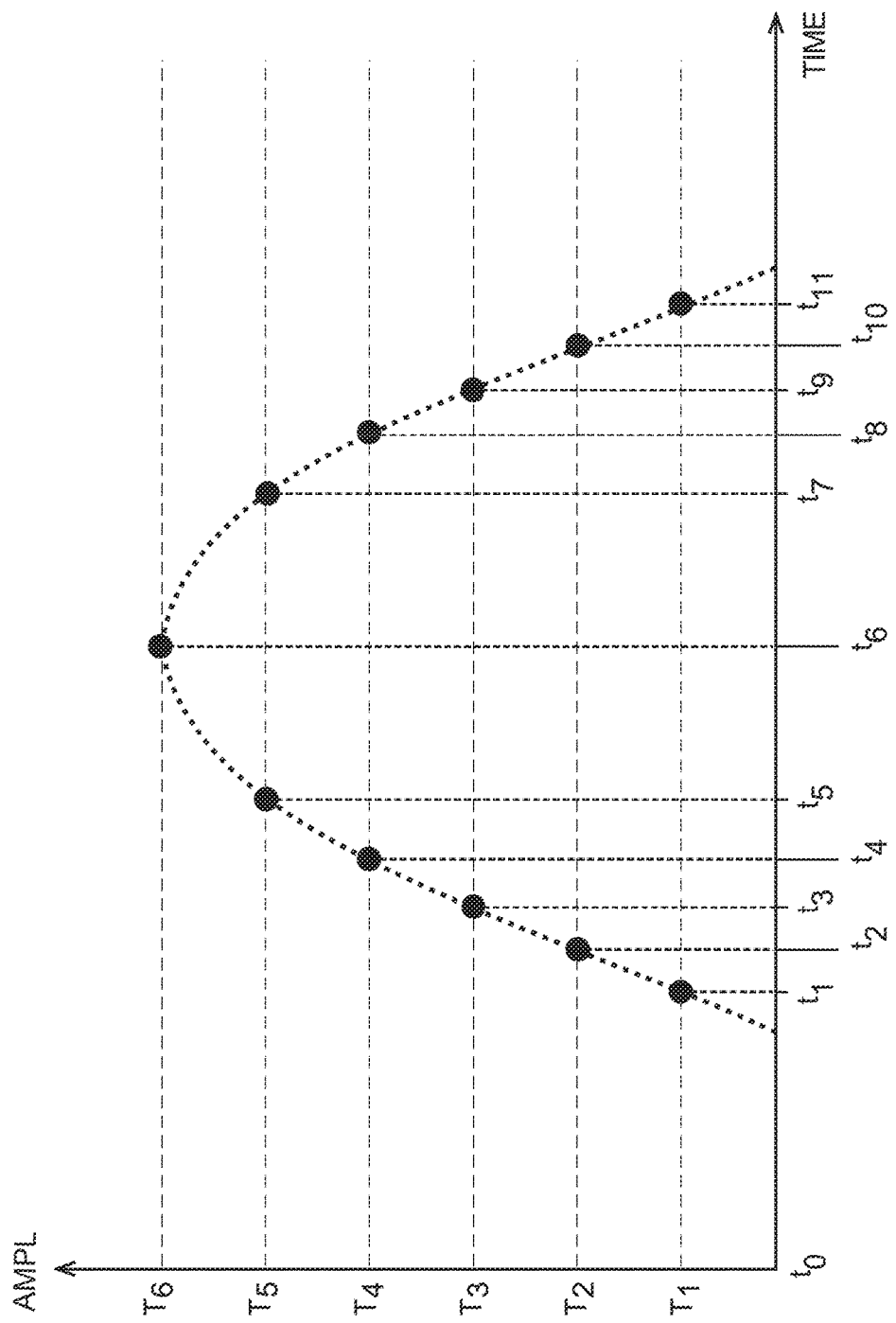
FIG. 14 depicts an example plot of detection points that may be produced by the envelope detector of FIG. 13.

As noted above, the envelope detector 614 receives the outputs of the TDCs 612 and analyzes these signals to recreate or produce an indication of the amplitude of the envelope of the detected light signal over time. An example of such a re-created envelope (which may include points indicative of the amplitude or magnitude of the light signal at various points in time) that may be produced by the envelope detector 614 is illustrated in FIG. 14. In the graph of FIG. 14, the received incoming light pulse is re-created based on the signals from the TDCs 612 associated with the various thresholds $T_1$ through $T_6$. More particularly the points in the graph of FIG. 14 indicate times (on the x-axis) at which one of the amplitude detection circuits 608 of FIG. 13 measured that the detected light signal went through one of the amplitude thresholds $T_1$-$T_6$ (on the y-axis) in the rising or falling direction. The time values $t_1$ through $t_{11}$ in FIG. 14 may be referred to as temporal positions. In the graph of FIG. 14, it will be understood that the detected light signal passed through the threshold $T_1$ in a positive direction at a time $t_1$ (which is the output of the amplitude detection circuit of FIG. 13 having the comparator 610A+), passed through the threshold $T_1$ in a negative direction at a time $t_{11}$ (which is the output of the amplitude detection circuit having the comparator 610A−), passed through the threshold $T_2$ in a positive direction at a time $t_2$, (which is the output of the amplitude detection circuit having the comparator 610B+), passed through the threshold $T_2$ in a negative direction at a time $t_{10}$ (which is the output of the amplitude detection circuit having the comparator 610B−), etc. In this manner, the envelope detector 614 may recreate the values of, the amplitude of, or the envelope of the received pulse at various times by plotting the threshold values associated with the various amplitude detection circuits 608 in a chronological order as determined by the outputs of the TDCs 612 of the amplitude detection circuits 608.

Once the outputs of the amplitude detection circuits 608 are plotted or ordered, the envelope detector 614 may then determine, fill in, or estimate one or more characteristics of the received or detected light pulse based on these amplitude points to create a complete amplitude or magnitude envelope associated with the received, scattered light pulse or light signal. For example, the envelope detector 614 may estimate the shape of the received pulse (e.g., the dotted line in FIG. 14) by connecting the points with a curve fitting routine (which typically includes using three or more points to perform pulse envelope estimation) or with straight lines, the envelope detector 614 may determine the amplitude of the detected light pulse as the highest detected threshold value or based on a curve fitting routine, the envelope detector 614 may determine the width of the detected light pulse in some statistical manner based on the rising and falling edges of the envelope, the envelope detector 614 may determine the peak or center of the detected light pulse based on the rising and falling edges of the envelope and/or the envelope detector 614 may determine any other desired characteristics of the envelope of the detected pulse. In the case of FIG. 14, the envelope detection circuit 614 may determine that the detected light pulse is generally a sinusoidal pulse having a maximum threshold value of $T_6$.

Of course, the envelope detector 614 may determine other information regarding the detected pulse, such as the shape, width, peak, center, etc., of the pulse and may provide some or all of this information to the range detector circuit 616 of FIG. 13. In particular, the range detector circuit 616 can use various known or new techniques to detect the range of the target from which the detected pulse was reflected, based on the round trip time it took the detected pulse to return to the detector and the speed of light in the appropriate medium (e.g., air). Such a range detector circuit 616 may, for example, use the detection time associated with the rising edge, the falling edge, the peak, the center, or some other point on the detected pulse. Of course, the range detector 616 may use common mathematical techniques to determine the range to the target from the lidar system based on the detected time of receipt of the reflected pulse and the speed of light in the appropriate medium, e.g., air. For example, the range detector circuit 616 may use a detection time associated with a first threshold value crossing on a rising edge of a detected pulse and a detection time associated with a second threshold value crossing on a falling edge of the detected pulse to determine the pulse width of the detected pulse, and use a look-up table, matrix, or other data structure to determine the time of receipt based on the pulse width of the detected pulse.

In one case, a lidar detector system, such as the detector system 600 of FIG. 13, may be used to compensate for a range detection phenomenon known as a range walk. Generally speaking, range walk is a phenomenon that occurs as a result of the fact that light pulses reflected from targets at the same range but with different reflectivity will result in reflected pulses having different intensities (which are based on the reflectivity of the target). In particular, as the reflectivity of the target increases, the intensity of the reflected pulse generally increases, although the reflected pulse intensity is also dependent on the power of the transmitted pulse, the range to the target, and the atmospheric conditions. However, range walk occurs because determining a range to the target based on rising or falling edge pulse detection of the return pulse produces a range measurement that is dependent on the intensity of the received pulse, which results in range detection errors.

Figure 15:
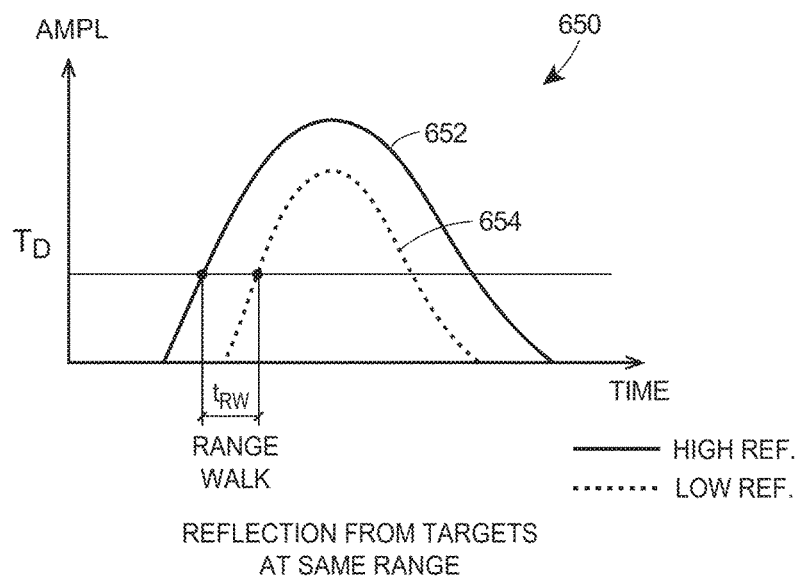
FIG. 15 depicts a graph illustrating range walk associated with the detection of pulses scattered or reflected from targets with different reflectivity at the same range.

FIG. 15 depicts a graph to illustrate the phenomenon of range walk. In particular, FIG. 15 depicts a graph 650 that illustrates two detected pulses 652 and 654, which are reflected from targets at the same range but having different reflectivity. The pulse 652 (illustrated with a solid line) is the result of a reflection of a particular transmit pulse from a target with a high reflectivity, while the pulse 654 (illustrated with a dotted line) is the result of a reflection of the same transmit pulse from a target at the same range but with a lower reflectivity. The horizontal line in FIG. 15 illustrates the points in time at which both of the pulses 652 and 654 pass through a particular detection threshold $T_D$. (for both the rising and falling edges of the pulses 652 and 654). Here the detection threshold $T_D$ is chosen to be between the maximum values of the returned pulses and the zero or noise level of the system. As illustrated in FIG. 15, the actual time at which the detected pulses 652 and 654 reach the threshold $T_D$ is different, as the lower intensity pulse 654 has a lower maximum amplitude, resulting in this pulse reaching the detection threshold $T_D$ later in time than the pulse 652. However, when range detection is performed based on the time the rising or falling edge of the detected pulse reaches the detection threshold $T_D$, the calculated range to the target will differ slightly for the two pulses 652 and 654, and in particular, will result in a range difference based on the time difference $t_{RW}$ between the times at which the pulses 652 and 654 reach the threshold value $T_D$. In fact, the detected range to the targets will differ by the distance that light travels during the time $t_{RW}$. Similarly, if range detection were to be keyed off of the falling edge of the pulses 652 and 654, a similar range walk detection error would occur.

A detection system similar to that, or based on the system of FIG. 13, can be configured to correct for or to eliminate the range walk error or phenomena. In particular, in this case, the detector system is configured to detect both the rising edge and the falling edge of a received light pulse as the envelope of the received light pulse passes through a particular detection (amplitude) threshold T. Detection circuitry within the detector system then determines the center of the received light pulse as the point equidistant in time between the detected rising and falling edges of the received light pulse, wherein the calculated center time of the detected pulse is assumed to be correlated with the peak value of the pulse. The range detector of the system then uses the time associated with the center of the received light pulse to determine the range to the target from which the reflected light pulse was received, and compensates for range walk because the time of receipt of the middle or maximum value of the pulse generally is not affected by the reflectivity of the target. This system thus compensates for the range walk phenomenon which occurs as a result of the fact that the detected time of receipt of both the rising and the falling edges of a reflected light pulse are dependent on the overall amplitude of the reflective light pulse which, in turn, is dependent on the reflectivity of the target, and which therefore causes targets of different reflectivity at the same range to appear to be at slightly different ranges. However, because this new system bases the range determination off of the time of receipt of the center of the received pulse, which is not dependent on the target reflectivity, this new system does not experience much, if any, range walk.

Figure 16:
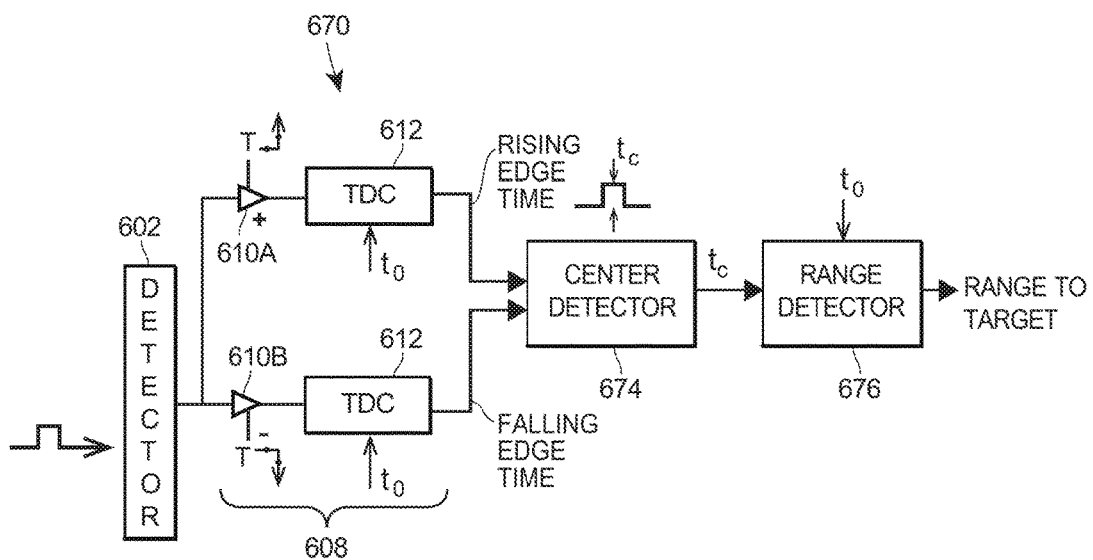
FIG. 16 illustrates an example lidar detection system that corrects for range ambiguity.

As an example, a detector system 670 of FIG. 16 can be used to compensate for or to eliminate the issue of range walk in determining an accurate range to a target that is not dependent on the reflectivity of the target. In particular, the detector system 670 of FIG. 16 includes a detector 602 (which may be the detector 602 of FIG. 13), two parallel-connected amplitude detection circuits 608 having comparators 610 and TDCs 612 as illustrated in FIG. 16, a center detector (or processor) 674 and a range detector (or processor) 676. In fact, the system 670 of FIG. 16 can use a sub-set of the amplitude detection circuits 608 of the detector system illustrated in and described with respect to FIG. 13. In this case, each of the comparators 610 receives a common or the same threshold value T, but a first one of the comparators (610A) is a rising-edge comparator that detects when the amplitude of the detected light pulse goes through the threshold T in the rising direction and a second one of the comparators (610B) is a falling-edge comparator that detects when the amplitude of the detected light pulse goes through the threshold T in the falling direction. As will be understood, the TDCs 612 determine the times (relative to the time $t_0$) at which the received pulse traverses or goes through the same detection threshold T during both the rising and falling edges of the pulse, in the manner described with respect to FIG. 13, and the TDCs 612 output those times to the center detector 674. The center detector 674 receives the two detection times as the rising-edge and falling-edge detection times of the received pulse, and computes or otherwise determines the time at which the center of the pulse was received based on these values. The center detector 674 may, for example, determine the time associated with the receipt of the center of the received pulse (the time $t_c$) as the time equidistant between the threshold T detection times output by the TDCs 612. The center detector 674 then outputs the signal indicative of the center time $t_c$ and provides this signal to the range detector 676, which determines the range to the target based on the time associate with the center of the received pulse. The center of the received pulse will generally align with the maximum amplitude or intensity of the received pulse, and performing range detection on targets using this center time ($t_c$) normalizes the range determination with respect to targets of different reflectivity, so that pulses reflected from targets at the same range but with different reflectivity will be detected as being at the same range as one another. Thus, this system provides for consistent detection of range without the issue of range walk, i.e., without the detected range being affected by or based on the reflectivity of the target.

Of course, while the system of FIG. 16 can be used in a simple case to determine the center of a pulse based on two parallel connected amplitude detection circuits 608 (i.e., two TDCs 612), other and more complex the detector systems, such as that of FIG. 13, could be used to determine the center of a received pulse. That is, the envelope detector 614 of FIG. 13 could detect or determine the center of the received pulse based on the output of more than two TDCs 612, based on the output of one or more TDCs 612 associated with the maximum detected threshold, based on a detected or estimated center of the received pulse determined from a re-created or detected envelope of the pulse (such as using a curve fitting routine to determine the center of the received pulse), etc.

Another issue that is common in scanning lidar systems is the issue of range ambiguity. Typically scanning lidar systems perform each single scan (of a set of successive scans) by visiting multiple scan points or scan positions within a predetermined field of view or field of regard (e.g., a horizontal and/or a vertical field of regard) associated with a scan. In this case, the lidar system spends a limited amount of time (referred to herein as a scan position time) at each of the scan positions for a particular scan, and when the lidar system has scanned through each of the scan positions in the field of regard, the lidar system performs a new scan (by revisiting each of the scan positions in the field of regard during the new scan). Moreover, at each scan position, that is, during a particular scan position time at a scan position, the scanning lidar system generally points the transmitter of the lidar system in a particular direction associated with the scan position, sends a transmit pulse in the particular direction, receives a reflected pulse, if any is returned, from the particular direction, and performs range detection on the reflected pulse, if any, for the scan position. The lidar system then moves to the next scan position and repeats this process until all of the scan positions have been visited within the scan.

As a result, scanning lidar systems typically are assumed to have a maximum detection range determined as the maximum range at which a target can be located from the transmitter such that a transmitted pulse can travel to the target within the field of regard of the transmitter for a particular scan position, reflect from the target, and return to the detector while the detector is still pointing in the direction of the transmitted pulse during the same scan position time. Range ambiguity can occur, however, when a pulse transmitted by the transmitter at a previous scan position time (i.e., a scan position time other than the scan position time associated with the current scan position) reflects from a highly cooperative target located beyond the assumed maximum detection range and returns to and is detected by the detector during the current scan position time (in which the detection system is expecting reflections only from the pulse transmitted during the current scan position time). Such reflections from targets located at a range greater than the maximum range of the system may occur, for example, as a result of a pulse sent by the transmitter when the transmitter was oriented to transmit in the same scan position during a previous scan, or as a result of a transmit pulse sent by the transmitter when the transmitter was oriented to transmit in a different scan position during the current scan, such as a pulse sent in the immediately preceding scan position time of the current scan. In either case, the reflection due to a previous transmitted pulse is detected at the detector and appears to the detection system as being a pulse reflected from a target as a result of the transmitted pulse sent during the current scan position time of the current scan, which the receiver resolves to be within the maximum detection range of the system. For example, in typical systems, if the maximum range of the system is 200 meters, and the previous transmitted pulse (from the previous scan position time) scatters from a reflective target located at 250 meters, then the reflection from the previous pulse can be mistaken for a reflection of the current pulse from a target located at 50 meters.

This phenomenon results in range ambiguity because the receiver cannot determine if a detected pulse is a result of a reflection of a transmitted pulse associated with the current scan position time (in which case the detected target is within the maximum detection range) or a result of a reflection of a transmitted pulse associated with a previous scan position time of the current scan or even a previous scan, in which case the detected target is beyond the maximum range.

To compensate for, and to potentially eliminate range ambiguity, a lidar system includes a transmitter that encodes successive or different transmit pulses with different pulse characteristics, and a receiver that detects the pulse characteristics of each received (reflected) pulse to be able to distinguish, to some degree at least, whether the reflected pulse is associated with a transmit pulse for the current scan position sent during the current scan position time, or associated with a transmit pulse for a previous scan position time or even a previous scan. This lidar system thus uses pulse encoding to distinguish between reflections from transmit pulses sent during different scan position times so that a reflection from a target by a pulse transmitted during a previous scan position time does not get confused with a reflection from a target by a transmit pulse sent during the current scan position time. More particularly, the new lidar system resolves range ambiguities by encoding pulses of successive or different scan position times and/or scans (scan periods) to have different pulse characteristics, such as different pulse widths (Basewell encoding), or different pulse envelope shapes (e.g., a single-hump pulse or a double-hump pulse), or different frequencies, or any other detectable pulse characteristics. The receiver includes a pulse decoder configured to detect the relevant pulse characteristics of the received pulse and a scan resolver that determines if the pulse characteristics of the received pulse matches the transmit pulse characteristics of the current scan position time or scan period or that of a previous scan position time or scan period. The receiver can then ignore detected pulses having pulse characteristics of a previous scan position time or scan period, thereby reducing range ambiguity caused by highly cooperative targets beyond the maximum detection range of the system.

In one case, the pulse decoder may use a plurality of time to digital convertors (TDCs) to detect the pulse characteristics of each received pulse. Still further, the pulse encoder can be an external optical modulator or the pulse encoder can be included in the light source (e.g., a current-modulated seed diode laser that is able to produce various pulse patterns) followed by an optical amplifier. The system can also encode the pulses with different wavelengths, e.g., by alternating pulses between two wavelengths. In this case, the receiver may include a dichroic filter (that separates the two wavelengths) and two APDs, with the separate APDs configured to detect the different wavelengths.

Figure 17:
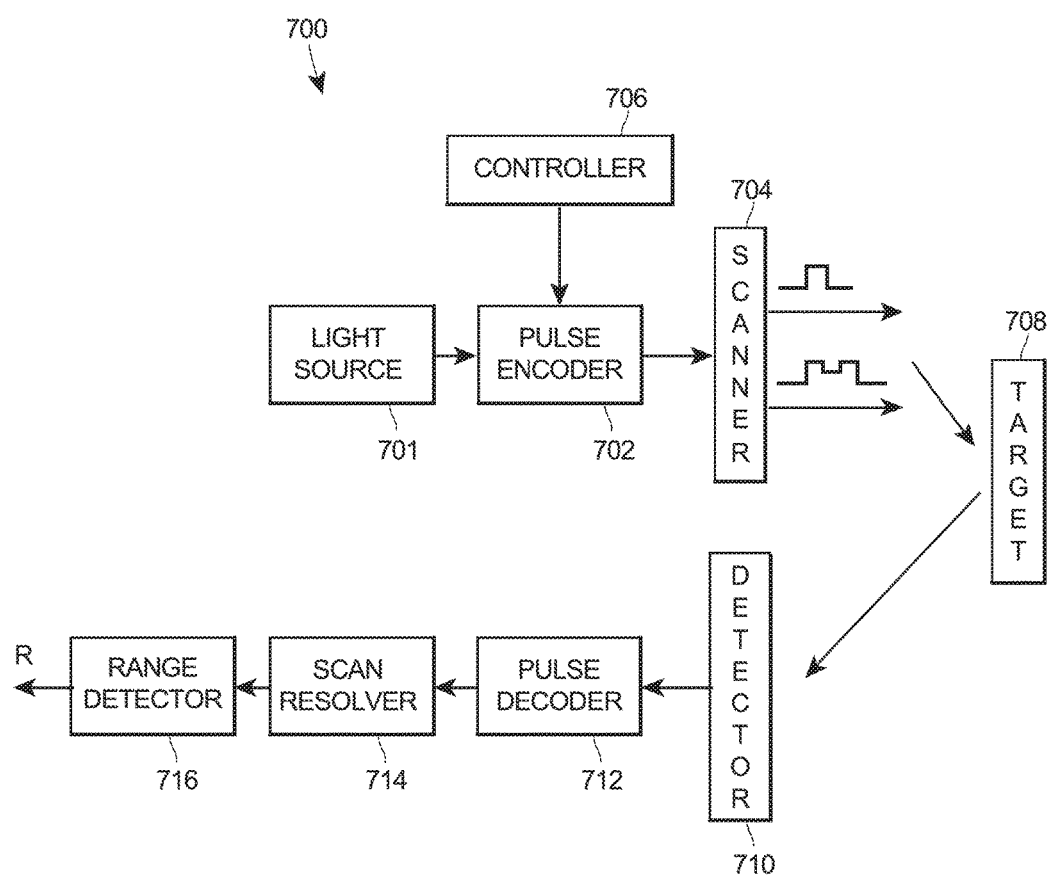
FIG. 17 illustrates an example lidar detection system that performs pulse encoding and decoding to compensate for range ambiguity.

FIG. 17 illustrates an example lidar system 700 having a transmitter with a pulse encoder and a receiver/detector with a pulse decoder that may be used to provide pulse encoding to the pulses sent from the transmitter and pulse decoding that decodes received pulses to distinguish between reflections based on different transmit pulses in different scans or in different scan position time periods of the same scan. In particular, FIG. 17 includes a light source 701, connected to a pulse encoder 702 that encodes the pulses generated by the light source 701 in some manner. The encoded light pulses are then provided to a scanning transmitter system 704 which transmits one or more encoded light pulses during each particular scan position time (associated with each scan position) of each scan. The system 700 also includes a controller 706, which may control the pulse encoder 702 to encode various different pulses provided by the light source 701 at different times to make transmit pulses sent during different scan position times different from one another. As a result, the pulse encoder 702 includes the ability to encode pulses to have one of at least two different pulse properties or different values for the same property. For example, the pulse encoder 702 may encode different pulses to have different pulse widths (Basewell encoding), pulse shapes (e.g., a single-hump pulse or a double-hump pulse), frequencies, etc. The pulse encoder 702 may encode the transmit pulses with any of two or more different pulse characteristics and may stagger the encoding in any desired manner to reduce or eliminate range ambiguity. For example, the pulse encoder 702 may encode all of the pulses of a particular scan with the same pulse characteristics but encode transmit pulses of successive scans with different pulse characteristics, the pulse encoder 702 may encode (in response to signals from the pulse encoding controller 706) transmit pulses of successive scan position times or scan positions with different pulse characteristics, or the pulse encoder 702 may perform any combination of these or other pulse encoding switching techniques. As noted above, the pulse encoder 702 can be an external optical modulator or the pulse encoder 702 can be included in the light source 701 (e.g., a current-modulated seed diode laser that is able to produce various pulse patterns) followed by an optical amplifier. The pulse encoder 702 may also or instead encode the pulses with different wavelengths, e.g., by alternating pulses between two or more wavelengths. In this case, the receiver may include a dichroic filter (that separates the two wavelengths) and two APDs, with the separate APDs configured to detect the different wavelengths. In another case, the light source may be controlled to alternate between two different pulse characteristics (e.g., two different pulse widths, or frequencies, or a one-hump pulse alternated with a two-hump pulse, etc.) In this case, the even pulses have one characteristic, and the odd pulses have a different characteristic. Of course, the light source could alternate between two, three or any other number of characteristics if desired.

In one example of the system 700 of FIG. 17, the transmitter may encode pulses by producing a single-hump pulse and a double-hump pulse at different scan positions, scan position times, or scans. The transmit pulses are then sent from the scanner 704 and reflect off of a target 708 and are detected by a detector 710, which provides signals indicative of detected light pulses to a pulse decoder 712. In one example, the decoder 712 may use the parallel connected amplitude detection circuits 608 (i.e., the comparators 610 and the TDCs 612) and the envelope detection circuit 614 of FIG. 13 to perform envelope detection on the received pulse or pulses so as to detect envelope characteristics of pulses (when pulse encoding is performed using pulse envelope manipulation). In any event, the pulse decoder 712 may detect the relevant pulse characteristics of the received pulse and provide the detected pulse characteristics of the detected pulse to a scan resolver 714.

The scan resolver 714 operates to resolve, to some degree, the scan and/or the scan position within the scan at which that transmit pulse that resulted in the reflected and received pulse was sent out from the transmitter, so as to resolve whether the received pulse is associated with the current scan position within the current scan or from a different scan position or scan. In a simple case, the scan resolver 714 may simply determine whether the pulse characteristics of the received pulse match the pulse characteristics of the transmit pulse for the current scan position or scan position time (i.e., the transmit pulse sent for the current scan position of the current scan) and may allow range detection by a range detector 716 based on that pulse if the characteristics of the received pulse match the pulse characteristics of the transmit pulse for the current scan position time. On the other hand, the scan resolver 714 may prevent the system or the range detector 716 from using the detected pulse for target and/or range detection when the characteristics of the received pulse do not match the pulse characteristics of the transmit pulse for the current scan position time. In more complicated systems, the scan resolver 714 may enable target and/or range detection beyond the normal maximum range of the system by resolving, based on the characteristics of a received pulse, the scan position time and/or the scan with which the received pulse is associated, and enabling the range detector 716 to perform range detection based on the transmit time of that scan position time instead of the transmit time of the current scan position time.

In yet another system, the circuitry of FIG. 13 may be used to provide an active short-wave infrared (SWIR) camera system that operates to determine a four-dimensional image at each point in a two-dimensional field of regard. In particular, the camera system includes a transmitter that transmits a pulse of light, preferably at the short-wave infrared spectrum, at a particular position or coordinate in a two-dimensional field of regard and a detector that detects return pulses reflected from a target in the field of regard coincident with the particular position. The camera system includes a range determination unit that determines, based on the timing of the returned pulse, a distance (or range) to the target at the particular position, and an intensity measurement unit that determines the amplitude or intensity of the returned pulse, which information provides an indication of the relative, or in some cases, absolute reflectivity of the target at the particular point in the field of regard. As a result, the camera system detects four components of each pixel in a two-dimensional field of regard, including the x and y positions in the two-dimensional imaging plane, a z position indicating a range or distance to the target at the x and y position, and an intensity or reflectivity of the target at the x, y, and z, position.

In one example, the range determination and the intensity measurement units may use a plurality of amplitude detection circuits (including comparators and TDCs such as those illustrated in FIG. 13) and an envelope detector, such as the envelope detector 614 of FIG. 13, to determine the envelope of the returned pulse which, in turn, can be processed to determine a highly accurate range to the target as well as an intensity profile of the returned pulse. In this case, the intensity profile of the returned pulse can be used to characterize the pulse and determine an absolute or relative reflectivity of the target based on calibration information (e.g., stored test measurements, known physical or mathematical principles, a look-up table, curve-fitting parameters, etc.). The range determination unit can include a range detector or a range finder 616, 676, 716, or 816, and the intensity measurement unit can include the intensity detector 818, discussed below. In general, the range determination unit and the intensity measurement unit can be implemented in hardware (e.g., as ASICs) or in firmware/software as sets of instructions stored in a persistent or volatile memory and executable by a processing unit such as the controller 150 or 306, for example.

Figure 18:
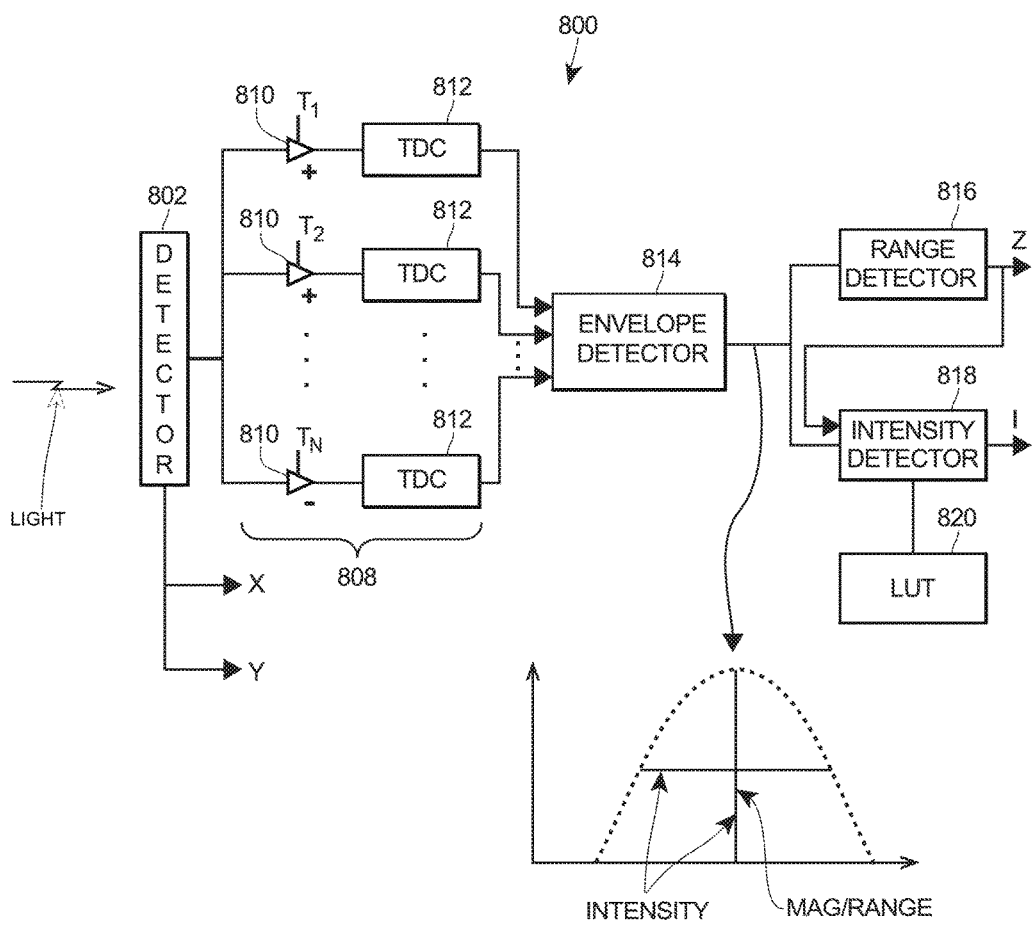
FIG. 18 illustrates an example lidar system used as a four-dimensional camera that determines the position of a point target in a two-dimensional field of regard, a range to the point target at a particular point in the field of regard and an intensity of a reflection or a reflectivity of the point target at a particular point in the field of regard.

FIG. 18 depicts an example lidar based camera system 800 that may be based, in large part, on the configuration of FIG. 13. In particular, the system 800 includes a transmitter (not shown) and a receiver with a detector 802, which may be the detector or APD 602 of FIG. 13, a set of parallel connected amplitude detectors 808 with amplifiers (not shown), comparators 810 and TDCs 812, and an envelope detection circuit 814. These components may all operate in any of the manners described above with respect to FIGS. 13-15. However, in this case, one or more outputs of the envelope detector 814 may be provided to a range detector 816 (also referred to as a range finder), which may operate the same as or similarly to the range detector 616 of FIG. 13 or 676 of FIG. 15, and an intensity detector 818. The envelope detector 814 and the range detector 816 may operate in the same manner as described above to produce or detect the envelope of a returned pulse and to find the range to the target based on that determined envelope or on points in the envelope. In one case, the envelope detector 816 may provide the time associated with the receipt of the center of the detected pulse (time $t_c$) for performing range detection.

As illustrated in FIG. 18, the system can then determine the three-dimensional position of an object (in a point cloud) as the x and y positions in the field of regard associated with the current transmitted pulse and the z position (output by the range detector 816) which is the range to the target. The x and y position defining the x and y coordinates of the point in the two-dimensional field of regard may be provided by the transmitter or scanning controller (not shown in FIG. 18). However, these values are illustrated in FIG. 18 as coming from the detector based on the two-dimensional position of the detector. Importantly, the intensity detector 818 may determine the intensity of the returned pulse based on the maximum amplitude of the reflected pulse, based on the width of the detected pulse (as compared to the width of the transmitted pulse), the overall power or energy of the pulse, or some combination thereof. Thus, the intensity of the reflected pulse can be determined from the characteristics of the envelope produced by the envelope detector 814.

As discussed earlier, the maximum intensity of the reflected pulse is dependent on the reflectivity of the target. As a result, the intensity detector 818 can use the determined intensity of the reflected pulse to determine the reflectivity of the target. In one example, the intensity detector 818 may determine the reflectivity of the target based on empirical calculations (i.e., using known physical or mathematical principles). In particular, the detector 818 knows or may receive an indication of the intensity of the emitted pulse (e.g., the width of the emitted pulse, the maximum amplitude of the emitted pulse, etc.) or may receive a measurement of the intensity of the emitted pulse measured as the pulse is sent out of the transmitter. The detector 818 also receives the determined range to the detected target from the range detector or range finder 816, and using these values, calculates the expected reflectivity of a perfectly reflective target (e.g., R=1.0, or R=100%) at that range using known light propagation models that define the decrease in intensity of light as the light propagates to and back from the target at that range. These models may account for light propagation in a particular medium (e.g., air), in a vacuum, etc. The detector 818 may then compare the detected intensity of the detected light pulse to the expected maximum intensity (of a totally reflective target) to determine the reflectivity of the target. The detector 818 may, on the other hand, simply calculate the reflectivity of the target that would provide the measured intensity of the reflected light pulse reflecting from a target at the determined range based on the intensity of the transmitted or emitted light pulse. In another example, the intensity detector 818 may store calibration information, such as for example, a look-up table 820 that stores target reflectivity values for targets at various ranges determined under known test conditions (e.g., using transmit pulses with known and/or the same power or energy as the camera transmitter and transmitted under known atmospheric conditions). Moreover, the look-up table 820 may store, for each target reflectivity, a known or measured reflected pulse intensity value or other reflected pulse characteristic for the target with the known reflectivity when pulsed under known conditions. The intensity detector 818 can then compare the determined intensity characteristics of the received pulse at the range determined by the range detector 816 to stored intensity characteristics of the stored targets in the look-up table 820 to determine the absolute reflectivity of the target.

Alternately or in addition to a look-up table 820, the intensity detector 818 may store calibration information that includes curve-fitting parameters defining one or more curves or equations that indicate reflectivity values versus distance determined under known test conditions. In another case, the intensity detector 818 may determine a relative reflectivity of targets based on the pulses received from different targets at the same range (or even different ranges) without the use of a reflectivity calculator as described above or a look-up table. In some cases, the intensity detector 818 may compare the maximum amplitude or the pulse width of the received reflected pulse with the intensity characteristics of the transmitted pulse, which are known, to determine a ratio of the intensity of the reflected pulse to the transmitted pulse. This ratio may also or instead be used to determine, via a look-up table or empirically, the reflectivity of the target.

As a result, the system of FIG. 18 may produce four values for each point in a two-dimensional field of regard, including the x and y positions of the point, a range of a target at the point and an intensity or reflectivity indication for the point.

In some cases, a lidar system may receive light from an external light source, and a reflectivity of a target may be determined to be greater than 100%. The lidar system may attribute light received from an external light source to scattered light from a pulse emitted by the lidar system, and as a result, a target may be anomalously assigned a reflectivity value that exceeds 100%. As an example, the detector element of the lidar system may detect sunlight, light from another lidar system, light from a streetlight or vehicle headlight, light from a LED or laser, or any other suitable source of light external to the lidar system. The received light from an external light source may be an accidental or nonintentional occurrence, or the received light may be associated with an intentional attempt to disrupt the operation of the lidar system by using an external light source to "jam" or "blind" the lidar system. If a target reflectivity is determined to be greater than 100%, the lidar system may disregard this reflectivity value and may attribute the anomalous reflectivity value to the presence of light from an external light source. Additionally, if multiple anomalous reflectivity values are determined, the lidar system may attribute this to an intentional effort to jam the lidar system.

General Considerations

In some cases, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blue-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In some cases, certain features described herein in the context of separate implementations may also be combined and implemented in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various implementations have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately, "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. A scanning system, comprising:
   a light source configured to emit light as a series of one or more light pulses;
   a scanner configured to direct the one or more light pulses towards a remote target; and
   a receiver configured to detect light scattered by the remote target, the receiver including a light detector element disposed on an application specific integrated circuit (ASIC), wherein the ASIC includes a plurality of comparators disposed in parallel with one another and a corresponding plurality of time-to-digital converters (TDCs) coupled to the comparators and wherein:
  each of the plurality of comparators processes a received electrical signal from the light detector element to produce a digital edge signal when the amplitude of the received electrical signal reaches a particular threshold; and
  a corresponding TDC of the plurality of TDCs outputs a time delay value associated with a time at which the received electrical signal reaches the particular threshold.

2. The scanning system of claim 1, wherein a first one of the plurality of comparators produces a digital edge signal when the amplitude of the received electrical signal reaches a particular threshold in the rising direction and a second one of the plurality of the comparators produces a digital edge signal when the amplitude of the received electrical signal reaches a particular threshold in the falling direction.

3. The scanning system of claim 1, wherein a first one of the plurality of comparators produces a digital edge signal when the amplitude of the received electrical signal reaches a particular threshold in the rising direction and a second one of the plurality of the comparators produces a digital edge signal when the amplitude of the received electrical signal reaches a different threshold in the rising direction.

4. The scanning system of claim 1, wherein a first multiplicity of the plurality of comparators produce a digital edge signal when the amplitude of the received electrical signal reaches one of a set of different thresholds in the rising direction and a second multiplicity of the plurality of the comparators produces a digital edge signal when the amplitude of the received electrical signal reaches one of the set of different thresholds in the falling direction.

5. The scanning system of claim 1, wherein a first one of the plurality of comparators produces a digital edge signal when the amplitude of the received electrical signal reaches a particular threshold and a second one of the plurality of the comparators produces a digital edge signal when the amplitude of the received electrical signal reaches a different threshold.

6. The scanning system of claim 1, wherein the receiver further comprises an envelope detector coupled to the plurality of TDCs that determines an amplitude envelope of a scattered light pulse based on the time delay values determined by the plurality of TDCs.

7. The scanning system of claim 6, wherein the envelope detector determines an amplitude envelope of the scattered light pulse based on the time delay values determined by three or more of the plurality of TDCs.

8. The scanning system of claim 1, wherein the receiver further comprises a center detector coupled to the plurality of TDCs that determines a center of a received scattered light pulse based on the time delay values determined by the plurality of TDCs.

9. The scanning system of claim 1, wherein the receiver further comprises a center detector coupled to the plurality of TDCs that determines a center of a received scattered light pulse based on the time delay values determined by exactly two of the plurality of TDCs.

10. The scanning system of claim 1, wherein one or more of the comparators are rising edge comparators and one or more other ones of the comparators are falling edge comparators.

11. A method of imaging a remote target, comprising:
  generating a light pulse;
  emitting the generated light pulse towards a remote target;
  receiving a light pulse scattered by the remote target;
  producing an electrical signal indicative of the received scattered light pulse;
  comparing the electrical signal to each of a plurality of different thresholds to produce a plurality of comparator signals;
  time-to-digital converting each of the plurality of comparator signals to produce a digital edge signal indicative of a time when the electrical signal reaches one of the thresholds; and
  using the digital edge signals to image the remote target.

12. The method of imaging a remote target of claim 11, wherein comparing the electrical signal to each of a plurality of different thresholds includes simultaneously comparing the electrical signal to each of the plurality of different thresholds.

13. The method of imaging a remote target of claim 11, wherein producing the electrical signal includes producing an electrical signal for each of a plurality of temporal positions along the received scattered light pulse, and wherein comparing the electrical signal further includes comparing the electrical signal to each of a plurality of different thresholds to produce a plurality of comparator signals and time-to-digital converting includes time-to-digital converting each of the plurality of comparator signals to produce the digital edge signals at each of the plurality of temporal positions along the received scattered light pulse.

14. The method of imaging a remote target of claim 13, wherein using the digital edge signals to image the remote target includes determining a time delay associated with the received scattered light pulse based on the digital edge signals and determining a range to the remote target based on the time delay associated with the received scattered light pulse.

15. The method of imaging a remote target of claim 11, wherein comparing the electrical signal to each of a plurality of different thresholds to produce a plurality of comparator signals includes comparing the electrical signal to a first threshold in the rising direction and comparing the electrical signal to the first threshold in the falling direction.

16. The method of imaging a remote target of claim 11, wherein comparing the electrical signal to each of a plurality of different thresholds to produce a plurality of comparator signals includes comparing the electrical signal to a first threshold in the rising direction and comparing the electrical signal to a second threshold in the falling direction.

17. The method of imaging a remote target of claim 11, wherein comparing the electrical signal to each of a plurality of different thresholds to produce a plurality of comparator signals includes comparing the electrical signal to a first multiplicity of thresholds in the rising direction and comparing the electrical signal to the first multiplicity of thresholds in the falling direction.

18. An imaging system, comprising:
  a laser light source that emits light as a series of one or more light pulses;
  a controller that controls the laser light source to emit one or more light pulses towards a remote target;
  a light detector configured to detect a light pulse scattered by the remote target to produce an electronic signal indicative of the received scattered light pulse;
  a plurality of comparators disposed in parallel with one another, wherein each of the plurality of comparators processes the electronic signal from the light detector to produce a digital edge signal when the amplitude of the received light signal reaches a threshold associated with the comparator;

a plurality of time-to-digital converters (TDCs) coupled to the comparators, wherein each of the plurality of TDCs receives a digital edge signal from a corresponding comparator and outputs a time delay value associated with a time at which the electronic signal reaches the threshold of the corresponding comparator; and an imaging processor that processes the time delay values to image the remote target.

19. The imaging system of claim 18, wherein each of the TDCs is coupled to the controller to receive an indication of a time at which a light pulse was emitted towards the remote target and wherein the time delay values output by the TDCs indicate a time between when the light pulse was emitted and the electronic signal reached a threshold of an associated one of the comparators.

20. The imaging system of claim 18, wherein the imaging processor comprises a range detector that determines, based on the time delay values, a timing of the receipt of the received light pulse, and that determines, based on the timing of the receipt of the received light pulse, a distance to the remote target.

* * * * *